US012630570B2

(12) United States Patent
Ryu et al.

(10) Patent No.: US 12,630,570 B2
(45) Date of Patent: May 19, 2026

(54) ORGANOMETALLIC ADDUCT COMPOUND AND METHOD OF MANUFACTURING INTEGRATED CIRCUIT DEVICE BY USING THE SAME

(71) Applicant: SAMSUNG ELECTRONICS CO., LTD., Suwon-si (KR)

(72) Inventors: Seungmin Ryu, Hwaseong-si (KR); Younsoo Kim, Yongin-si (KR); Jaewoon Kim, Seoul (KR); Kazuki Harano, Tokyo (JP); Kazuya Saito, Tokyo (JP); Takanori Koide, Tokyo (JP); Yutaro Aoki, Tokyo (JP); Gyuhee Park, Hwaseong-si (KR); Younjoung Cho, Hwaseong-si (KR); Wakana Fuse, Tokyo (JP); Yoshiki Manabe, Tokyo (JP); Hiroyuki Uchiuzou, Tokyo (JP); Masayuki Kimura, Tokyo (JP); Takahiro Yoshii, Tokyo (JP)

(73) Assignees: SAMSUNG ELECTRONICS CO., LTD., Suwon-si (KR); ADEKA CORPORATION, Tokyo (JP)

( * ) Notice: Subject to any disclaimer, the term of this patent is extended or adjusted under 35 U.S.C. 154(b) by 1020 days.

(21) Appl. No.: 17/708,323

(22) Filed: Mar. 30, 2022

(65) Prior Publication Data

US 2022/0324887 A1 Oct. 13, 2022

(30) Foreign Application Priority Data

Apr. 2, 2021 (KR) ........................ 10-2021-0043507
Sep. 15, 2021 (KR) ........................ 10-2021-0123465

(51) Int. Cl.

| | |
|---|---|
| ***C07F 9/00*** | (2006.01) |
| ***C23C 16/34*** | (2006.01) |
| ***C23C 16/455*** | (2006.01) |
| ***H10B 12/00*** | (2023.01) |
| ***H10D 1/68*** | (2025.01) |

(52) U.S. Cl.
CPC .............. *C07F 9/005* (2013.01); *C23C 16/34* (2013.01); *C23C 16/45553* (2013.01); *H10B 12/033* (2023.02); *H10D 1/692* (2025.01)

(58) Field of Classification Search
CPC ......... C07F 9/005; C01G 33/00; C01G 35/00; C23C 16/45553
See application file for complete search history.

(56) References Cited

U.S. PATENT DOCUMENTS

| | | | |
|---|---|---|---|
| 6,984,591 | B1 | 1/2006 | Buchanan et al. |
| 7,749,574 | B2 | 7/2010 | Mahajani et al. |
| 8,236,381 | B2 | 8/2012 | Okubo et al. |
| 8,395,264 | B2 | 3/2013 | Ito et al. |
| 8,460,989 | B2 | 6/2013 | Blasco et al. |
| 10,106,887 | B2 | 10/2018 | Lansalot-Matras et al. |
| 2008/0038466 | A1 | 2/2008 | Reuter et al. |
| 2008/0107825 | A1 | 5/2008 | Ishizaka et al. |
| 2016/0088756 | A1 | 3/2016 | Ramadas |

FOREIGN PATENT DOCUMENTS

| | | | |
|---|---|---|---|
| JP | S59130270 | A | 7/1984 |
| JP | 2004-353024 | A | 12/2004 |
| JP | 2006-169617 | A | 6/2006 |
| JP | 2012-505177 | A | 3/2012 |
| JP | 2015-183221 | A | 10/2015 |
| KR | 10-2021-0117121 | A | 9/2021 |
| TW | 201503447 | A | 1/2015 |
| WO | WO 2010-087392 | | 8/2010 |

OTHER PUBLICATIONS

S. B. Basuvalingam, et al, 36 Journal of Vacuum Science & Technology A, 041503 (2018) (Year: 2018).*
O.K. Poleshchuk, et al, 101 International journal of quantum chemistry, 869-877 (2005) (Year: 2005).*
A. Monassier, et al, 5(6).ChemCatChem, 1321-1324 (2013) (Year: 2013).*
F. Brotzel, et al, 13. Chemistry—A European Journal, 336-345 (2007) (Year: 2007).*
B. P. Dailey and J. N. Shoolery. 77 Journal of the American Chemical Society 3977-3981(1955) (Year: 1955).*
CAS abstract RN 502845-16-1 (Year: 2005).*
A. Antiñolo, et al, 5 Dalton Transactions, 910-917 (2003)("Antiñolo") (Year: 2003).*
CAS abstract RN 574742-04-4 (Year: 2003).*
First Office Action dated Jul. 4, 2024 for corresponding TW Patent Application No. 111134978.
Fuggle et al., "Niobium, Tantalum and molybdenum pentafluoride complexes with organic ligands," Journal of Fluorine Chemistry 1.4 (1972): 427-431.
Haiges et al., "Adduct Formation of Tantalum (V)-and Niobium (V) Fluoride with Neutral Group 15 Donor Ligands, an Example for Ligand Induced Self-Ionization," Zeitschrift für anorganische und allgemeine Chemie 640.8-9 (2014): 1568-1575.
O'Keane, "Oxidative coupling reactions of pyridine," Ph.D. Thesis. University of Glasgow, 1971.

(Continued)

*Primary Examiner* — Alexander R Pagano
*Assistant Examiner* — Frank S. Hou
(74) *Attorney, Agent, or Firm* — Muir Patent Law, PLLC

(57) ABSTRACT

An organometallic adduct compound and a method of manufacturing an integrated circuit device, the organometallic adduct compound being represented by General Formula (I):

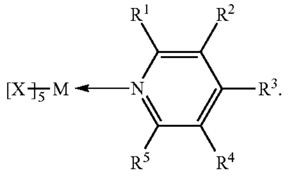

16 Claims, 16 Drawing Sheets

(56) References Cited

OTHER PUBLICATIONS

Doklady Akademii Nauk, “Reactions of phosphorus and tantalum pentafluorides with picolinic acid,” (1985), vol. 283, No. 4, p. 904-907.
Fuggle et al., “Reactions of niobium and tatalum pentafluorides with trimethylsilyldiethylamine and with trimethylsilylchloride,” Journal of the Chemical Society, Dalton Transactions 16 (1972): 1766-1768.
McCarley, R.E., et al, “Reactions of some niobium (V) and Tatalum (V) halides with pyridine,” 1962. 243-255.

* cited by examiner

ORGANOMETALLIC ADDUCT COMPOUND AND METHOD OF MANUFACTURING INTEGRATED CIRCUIT DEVICE BY USING THE SAME

CROSS-REFERENCE TO RELATED APPLICATIONS

This application is based on and claims priority under 35 U.S.C. § 119 to Korean Patent Application No. 10-2021-0043507, filed on Apr. 2, 2021, and Korean Patent Application No. 10-2021-0123465, filed on Sep. 15, 2021, in the Korean Intellectual Property Office, the disclosures of which are incorporated herein in their entirety by reference.

BACKGROUND

1. Field

Embodiments relate to an organometallic adduct compound and a method of manufacturing an integrated circuit device by using the organometallic adduct compound.

2. Description of the Related Art

Due to the development of electronic technology, semiconductor devices have been rapidly down-scaled in recent years, and thus, patterns constituting electronic devices have been finer-sized.

SUMMARY

The embodiments may be realized by providing an organometallic adduct compound represented by General Formula (I):

General Formula (I)

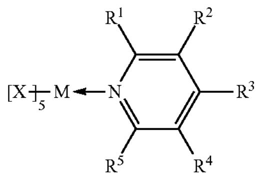

wherein, in General Formula (I), $R^1$, $R^2$, $R^3$, $R^4$, and $R^5$ are each independently a hydrogen atom, a halogen atom, a substituted or unsubstituted C1 to C5 linear alkyl group, a substituted or unsubstituted C3 to C5 branched alkyl group, a substituted or unsubstituted C2 to C5 linear alkenyl group, or a substituted or unsubstituted C3 to C5 branched alkenyl group, X is a halogen atom, and M is a niobium atom or a tantalum atom.

The embodiments may be realized by providing a method of manufacturing an integrated circuit device, the method comprising forming a metal-containing film on a substrate by using an organometallic adduct compound represented by General Formula (I):

General Formula (I)

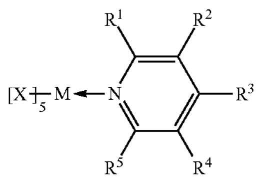

wherein, in General Formula (I), $R^1$, $R^2$, $R^3$, $R^4$, and $R^5$ are each independently a hydrogen atom, a halogen atom, a substituted or unsubstituted C1 to C5 linear alkyl group, a substituted or unsubstituted C3 to C5 branched alkyl group, a substituted or unsubstituted C2 to C5 linear alkenyl group, or a substituted or unsubstituted C3 to C5 branched alkenyl group, X is a halogen atom, and M is a niobium atom or a tantalum atom.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
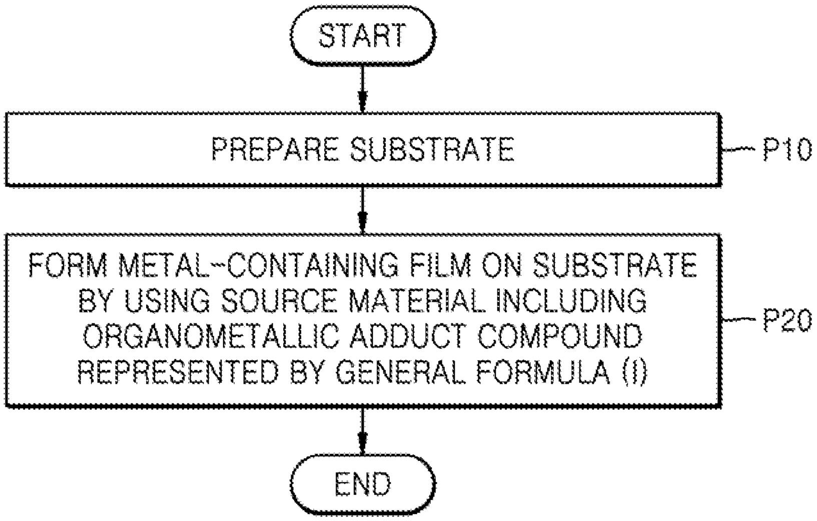
FIG. 1 is a flowchart of a method of manufacturing an integrated circuit device, according to embodiments.

As used herein, the term “substrate” may refer to a substrate itself, or a stack structure including a substrate and a certain layer or film or the like formed on a surface of the substrate. In addition, as used herein, the term “surface of a substrate” may refer to an exposed surface of the substrate itself, or an outer surface of a certain layer or film or the like formed on the substrate. As used herein, the abbreviation “Me” refers to a methyl group, the abbreviation “Et” refers to an ethyl group, the abbreviation “nPr” refers to a normal propyl group, and the abbreviation “tBu” refers to a tert-butyl group (1,1-dimethylethyl group). As used herein, the term “room temperature” or “ambient temperature” refers to a temperature ranging from about 20° C. to about 28° C., and may vary with seasons. As used herein, the term “or” is not an exclusive term, e.g., “A or B” would include A, B, or A and B.

An organometallic adduct compound according to an embodiment may have a structure in which a pyridine derivative is bonded, in the form of an adduct, to a coordination metal compound. The organometallic adduct compound according to an embodiment may be represented by General Formula (I).

General Formula (I)

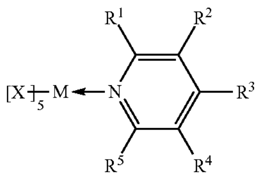

In General Formula (I), $R^1$, $R^2$, $R^3$, $R^4$, and $R^5$ may each independently be or include, e.g., a hydrogen atom, a halogen atom, a substituted or unsubstituted C1 to C5 linear alkyl group, a substituted or unsubstituted C3 to C5 branched alkyl group, a substituted or unsubstituted C2 to C5 linear alkenyl group, or a substituted or unsubstituted C3 to C5 branched alkenyl group.

X may be, e.g., a halogen atom.

M may be, e.g., a niobium atom or a tantalum atom. In General Formula (I), the arrow may represent a coordinate or dative bond.

In an implementation, in General Formula (I), $R^1$, $R^2$, $R^3$, $R^4$, and $R^5$ may each independently be, e.g., a fluorine atom, a chlorine atom, a bromine atom, a methyl group, an ethyl group, an n-propyl group, an isopropyl group, an n-butyl group, an isobutyl group, a sec-butyl group, a tert-butyl group, an n-pentyl group, an isopentyl group, a sec-pentyl group, a tert-pentyl group, a neopentyl group, a 3-pentyl group, a vinyl group, a propenyl group, a butenyl group, a pentenyl group, a monofluoromethyl group, a difluoromethyl group, a trifluoromethyl group, a trifluoroethyl group, a trifluoropropyl group, a trifluoroisopropyl group, a hexafluoroisopropyl group, a dimethyltrifluoroethyl group, a (trifluoromethyl)tetrafluoroethyl group, or a nonafluoro-tert-butyl group.

In an implementation, in General Formula (I), X may be, e.g., a fluorine atom, a chlorine atom, or a bromine atom. In an implementation, when X is a fluorine atom or a chlorine atom, the organometallic adduct compound according to General Formula (I) may have a relatively low melting point and may have a relatively high vapor pressure.

In an implementation, in General Formula (I), at least one of $R^1$, $R^2$, $R^3$, $R^4$, and $R^5$ may include, e.g., a halogen atom.

In an implementation, in General Formula (I), at least one of $R^1$, $R^2$, $R^3$, $R^4$, and $R^5$ may be, e.g., a fluorine atom, a fluorine atom-substituted C1 to C5 linear alkyl group, a fluorine atom-substituted C3 to C5 branched alkyl group, a fluorine atom-substituted C2 to C5 linear alkenyl group, or a fluorine atom-substituted C3 to C5 branched alkenyl group.

In an implementation, in General Formula (I), one $R^1$, $R^2$, $R^3$, $R^4$, and $R^5$ may be, e.g., a hydrogen atom, another one of $R^1$, $R^2$, $R^3$, $R^4$, and $R^5$ may be, e.g., a fluorine atom, and yet another one of $R^1$, $R^2$, $R^3$, $R^4$, and $R^5$ may be, e.g., a fluorine atom-substituted C1 to C5 linear alkyl group, a fluorine atom-substituted C3 to C5 branched alkyl group, a fluorine atom-substituted C2 to C5 linear alkenyl group, or a fluorine atom-substituted C3 to C5 branched alkenyl group.

In an implementation, in General Formula (I), at least one of $R^1$ and $R^2$ may be, e.g., a fluorine atom.

In an implementation, in General Formula (I), M may be, e.g., a niobium atom, and at least one of $R^1$, $R^2$, $R^3$, $R^4$, and $R^5$ may be, e.g., a halogen atom.

In an implementation, in General Formula (I), X may be, e.g., a fluorine atom or a chlorine atom, M may be, e.g., a niobium atom, and at least one of $R^1$, $R^2$, $R^3$, $R^4$, and $R^5$ may be, e.g., a fluorine atom.

In an implementation, in General Formula (I), M may be, e.g., a niobium atom, and at least one of $R^1$, $R^2$, $R^3$, $R^4$, and $R^5$ may be, e.g., a fluorine atom, a fluorine atom-substituted C1 to C5 linear alkyl group, a fluorine atom-substituted C3 to C5 branched alkyl group, a fluorine atom-substituted C2 to C5 linear alkenyl group, or a fluorine atom-substituted C3 to C5 branched alkenyl group.

In an implementation, in General Formula (I), M may be, e.g., a tantalum atom, and at least one of $R^1$, $R^2$, $R^3$, $R^4$, and $R^5$ may be, e.g., a fluorine atom, a fluorine atom-substituted C1 to C5 linear alkyl group, a fluorine atom-substituted C3 to C5 branched alkyl group, a fluorine atom-substituted C2 to C5 linear alkenyl group, or a fluorine atom-substituted C3 to C5 branched alkenyl group.

In an implementation, in General Formula (I), X may be, e.g., a fluorine atom or a chlorine atom, and at least one of $R^1$, $R^2$, $R^3$, $R^4$, and $R^5$ may include, e.g., a fluorine atom.

In an implementation, in General Formula (I), X may be, e.g., a fluorine atom, and at least one of $R^1$, $R^2$, $R^3$, $R^4$, and $R^5$ may be, e.g., a fluorine atom, a fluorine atom-substituted C1 to C5 linear alkyl group, a fluorine atom-substituted C3 to C5 branched alkyl group, a fluorine atom-substituted C2 to C5 linear alkenyl group, or a fluorine atom-substituted C3 to C5 branched alkenyl group.

In an implementation, in General Formula (I), M may be, e.g., a niobium atom or a tantalum atom, and X may be, e.g., a fluorine atom or a chlorine atom.

In an implementation, to form a high-quality thin film with excellent productivity, in General Formula (I), when M is a niobium atom, at least one of $R^1$, $R^2$, $R^3$, $R^4$, and $R^5$ may be, e.g., a halogen atom, a C1 to C3 alkyl group, a C2 to C3 alkenyl group, or a fluorine atom-substituted C1 to C3 alkyl group. In an implementation, in General Formula (I), when M is a niobium atom, at least one of $R^1$, $R^2$, $R^3$, $R^4$, and $R^5$ may be, e.g., a fluorine atom, a chlorine atom, a methyl group, an ethyl group, a trifluoromethyl group, or a trifluoroethyl group.

In an implementation, to form a high-quality thin film with excellent productivity, in General Formula (I), when M is a niobium atom, two to four of $R^1$, $R^2$, $R^3$, $R^4$, and $R^5$ may each be, e.g., a hydrogen atom, and one to three of $R^1$, $R^2$, $R^3$, $R^4$, and $R^5$ may each be, e.g., a halogen atom, a C1 to C5 alkyl group, a C2 to C5 alkenyl group, or a fluorine atom-substituted C1 to C5 alkyl group. In an implementation, three or four of $R^1$, $R^2$, $R^3$, $R^4$, and $R^5$ may each be, e.g., a hydrogen atom, and one or two of $R^1$, $R^2$, $R^3$, $R^4$, and $R^5$ may each be, e.g., a halogen atom, a C1 to C5 alkyl group, a C2 to C5 alkenyl group, or a fluorine atom-substituted C1 to C5 alkyl group. In an implementation, $R^1$, $R^3$, $R^4$, and $R^5$ may each be, e.g., a hydrogen atom, and $R^2$ may be, e.g., a halogen atom, a C1 to C5 alkyl group, a C2 to C5 alkenyl group, or a fluorine atom-substituted C1 to C5 alkyl group. In an implementation, $R^2$, $R^3$, and $R^4$ may each be, e.g., a hydrogen atom, and $R^1$ and $R^5$ may each be, e.g., a halogen atom, a C1 to C5 alkyl group, a C2 to C5 alkenyl group, or a fluorine atom-substituted C1 to C5 alkyl group.

The organometallic adduct compound according to an embodiment may have a structure in which a pyridine derivative is bonded, in the form of an adduct, to a coordination metal compound, and may provide excellent thermal stability. Accordingly, when the organometallic adduct compound according to an embodiment is used as a precursor of a metal in forming a metal-containing film by a chemical vapor deposition (CVD) process or an atomic layer deposition (ALD) process, the organometallic adduct compound according to an embodiment may be stably transported without decomposition due to heat during the transport thereof from a storage container to a reaction chamber. In addition, when the organometallic adduct compound according to an embodiment has been transported to a deposition reaction chamber for forming a metal-containing film, the organometallic adduct compound may be easily decomposed due to a process temperature in the reaction chamber and thus may not affect a surface reaction for forming a metal-containing film. Therefore, when a metal-containing film is formed by using the organometallic adduct compound according to an embodiment, a phenomenon, in which undesired foreign materials such as carbon residue remain in a metal-containing film intended to be formed, may be suppressed, and the organometallic adduct compound may be suitably used as a source material for forming a low-resistance metal-containing film with good quality and may improve the productivity of a manufacturing process of an integrated circuit device.

Examples of the organometallic adduct compound according to an embodiment may be represented by the following Formulae 1 to 456.

Formula 1

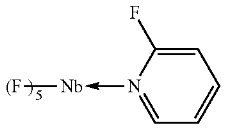

Formula 2

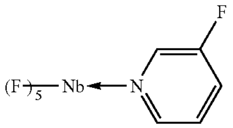

Formula 3

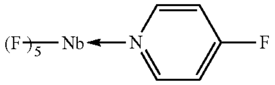

Formula 4

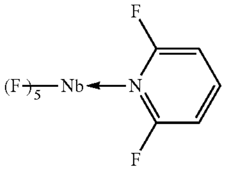

Formula 5

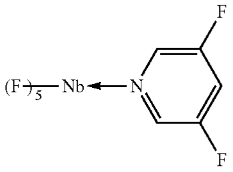

Formula 6

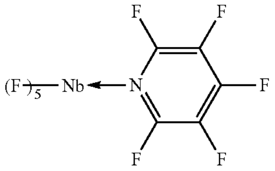

Formula 7

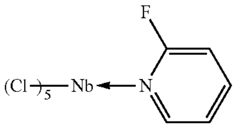

Formula 8

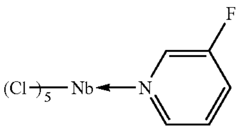

Formula 9

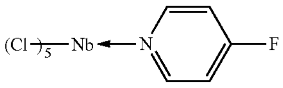

-continued

Formula 10

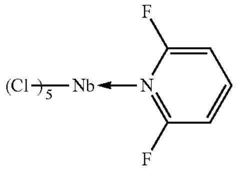

Formula 11

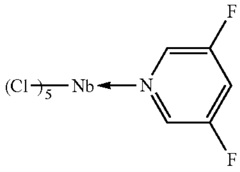

Formula 12

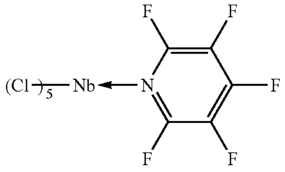

Formula 13

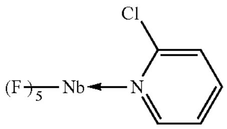

Formula 14

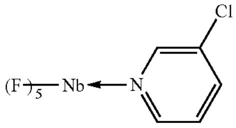

Formula15

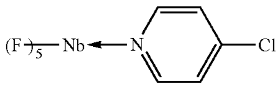

Formula 16

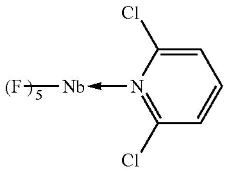

Formula 17

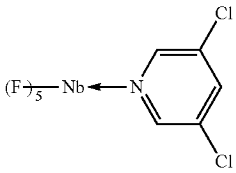

Formula 18

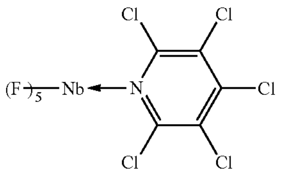

Formula 19

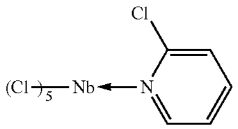

-continued
Formula 20
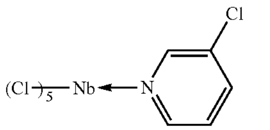
Formula 21
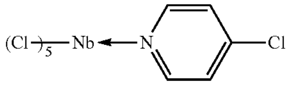
Formula 22
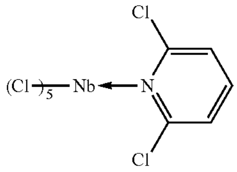
Formula 23
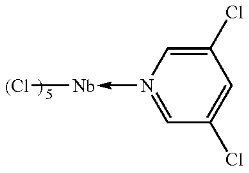
Formula 24
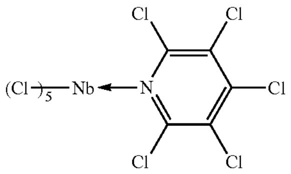
Formula 25
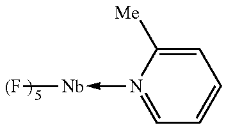
Formula 26
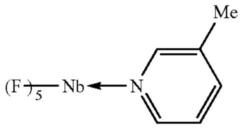
Formula 27
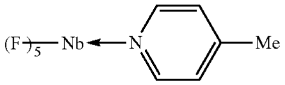
Formula 28
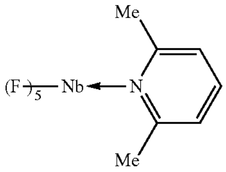
Formula 29
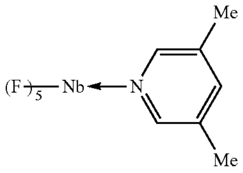
-continued
Formula 30
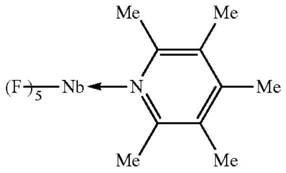
Formula 31
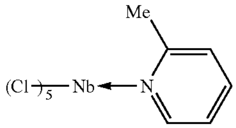
Formula 32
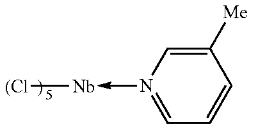
Formula 33
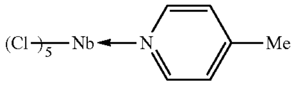
Formula 34
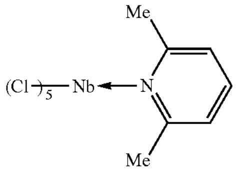
Formula 35
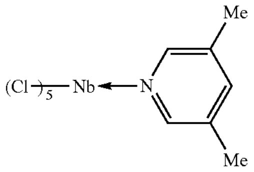
Formula 36
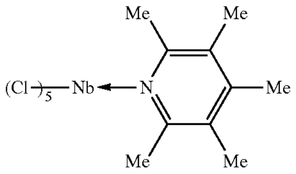
Formula 37
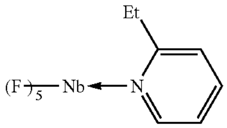
Formula 38
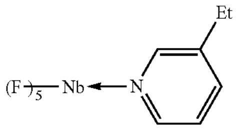
Formula 39
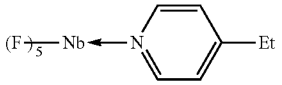

-continued
Formula 40
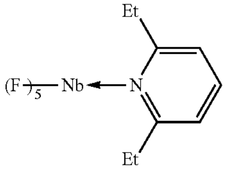
Formula 41
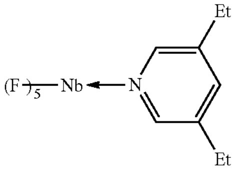
Formula 42
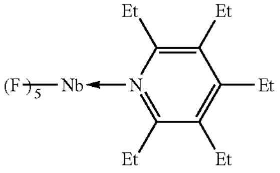
Formula 43
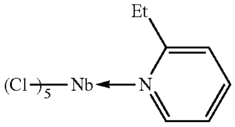
Formula 44
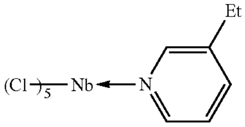
Formula 45
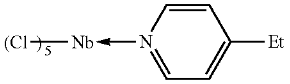
Formula 46
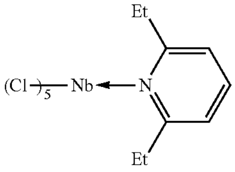
Formula 47
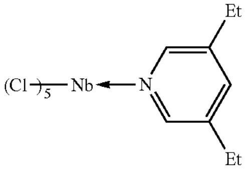
Formula 48
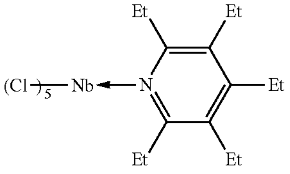
Formula 49
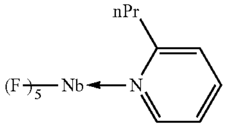
-continued
Formula 50
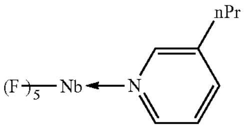
Formula 51
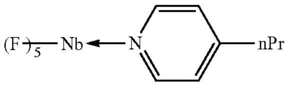
Formula 52
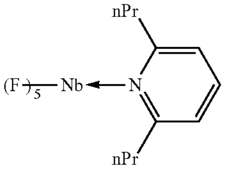
Formula 53
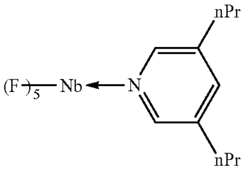
Formula 54
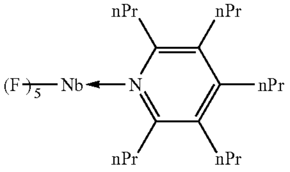
Formula 55
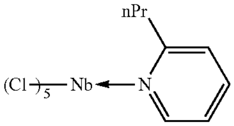
Formula 56
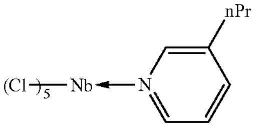
Formula 57
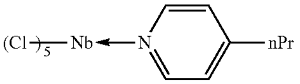
Formula 58
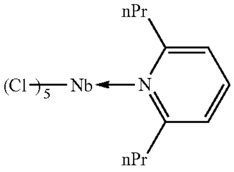
Formula 59
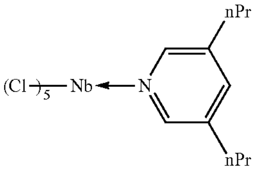

-continued
Formula 60
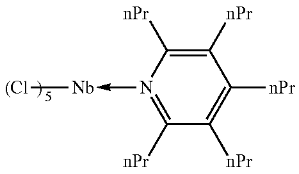
Formula 61
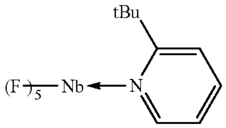
Formula 62
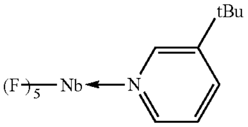
Formula 63
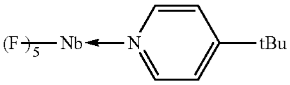
Formula 64
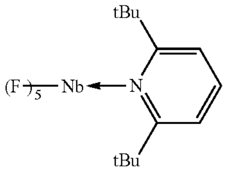
Formula 65
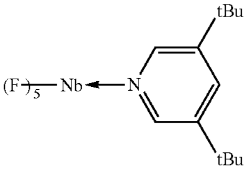
Formula 66
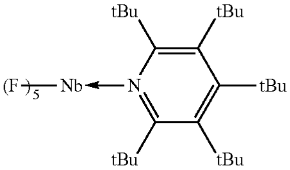
Formula 67
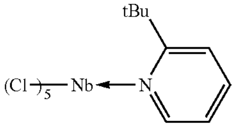
Formula 68
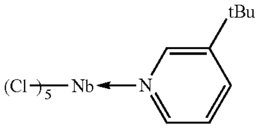
Formula 69
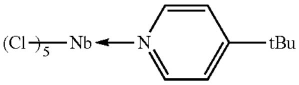
-continued
Formula 70
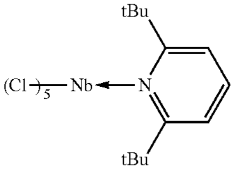
Formula 71
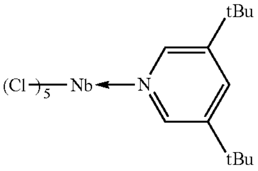
Formula 72
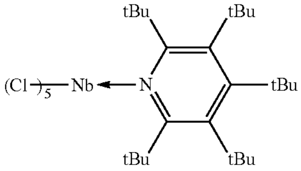
Formula 73
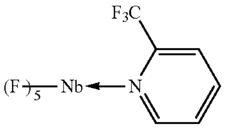
Formula 74
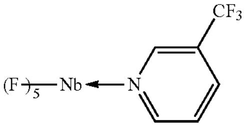
Formula 75
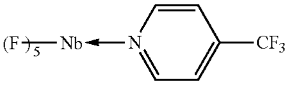
Formula 76
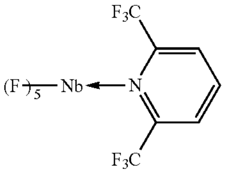
Formula 77
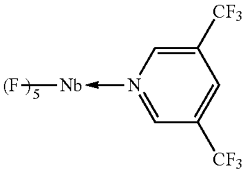
Formula 78
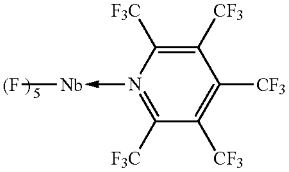
Formula 79
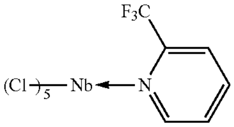

-continued
Formula 80
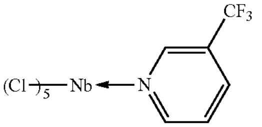
Formula 81
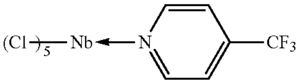
Formula 82
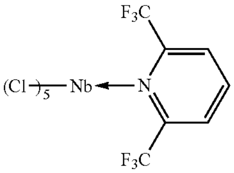
Formula 83
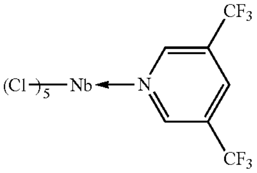
Formula 84
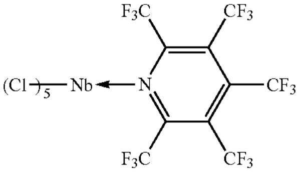
Formula 85
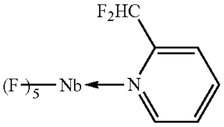
Formula 86
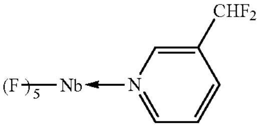
Formula 87
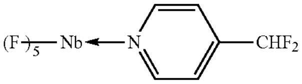
Formula 88
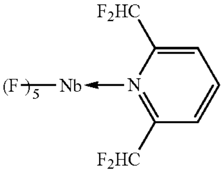
Formula 89
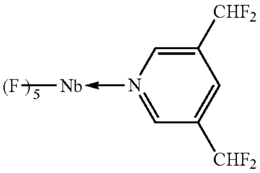
-continued
Formula 90
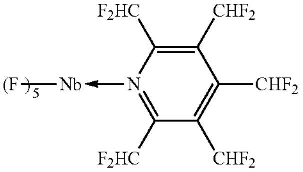
Formula 91
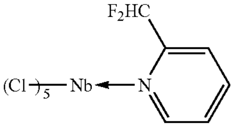
Formula 92
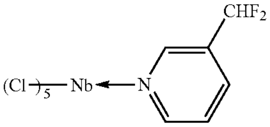
Formula 93
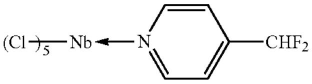
Formula 94
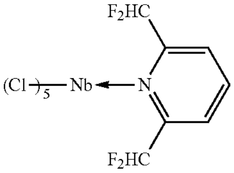
Formula 95
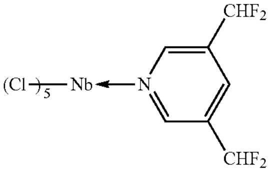
Formula 96
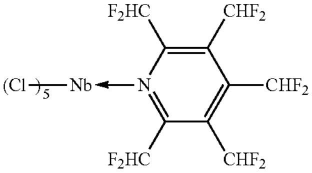
Formula 97
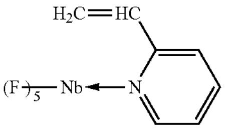
Formula 98
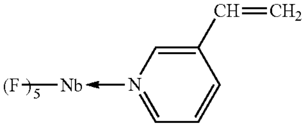
Formula 99
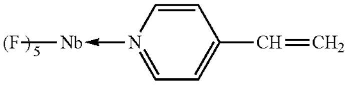

-continued
Formula 100
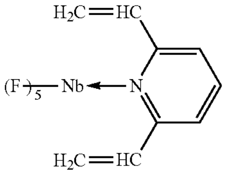
Formula 101
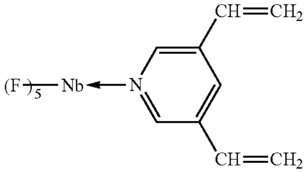
Formula 102
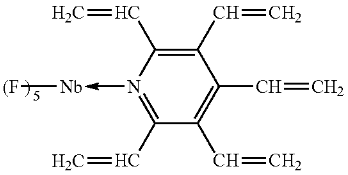
Formula 103
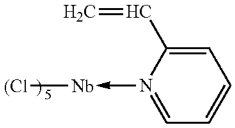
Formula 104
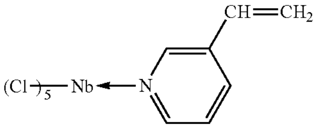
Formula 105
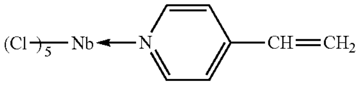
Formula 106
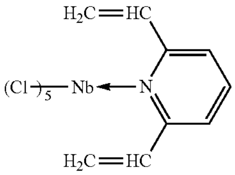
Formula 107
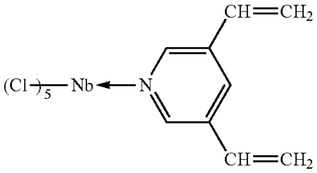
Formula 108
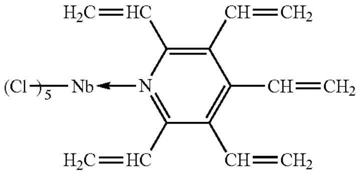
Formula 109
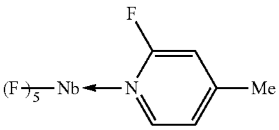
-continued
Formula 110
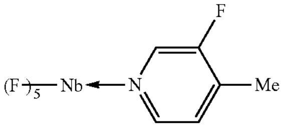
Formula 111
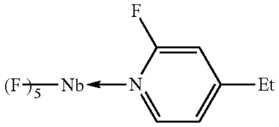
Formula 112
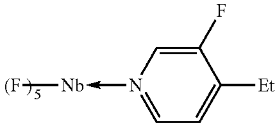
Formula 113
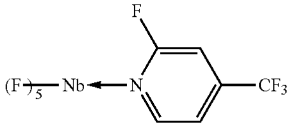
Formula 114
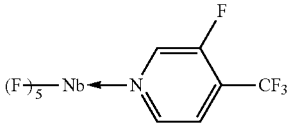
Formula 115
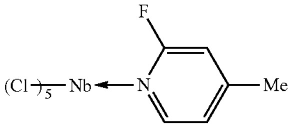
Formula 116
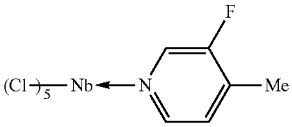
Formula 117
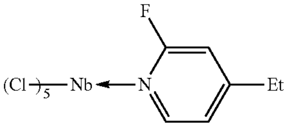
Formula 118
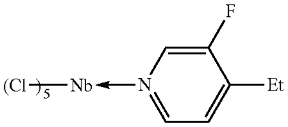
Formula 119
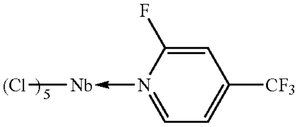
Formula 120
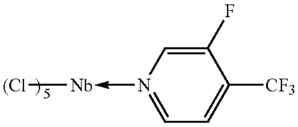

-continued
Formula 121
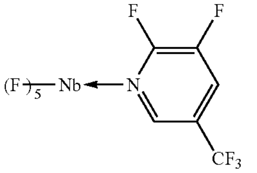
Formula 122
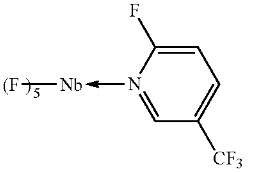
Formula 123
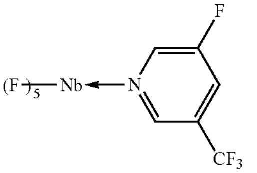
Formula 124
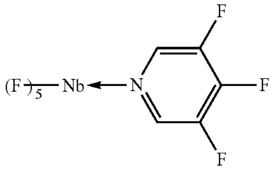
Formula 125
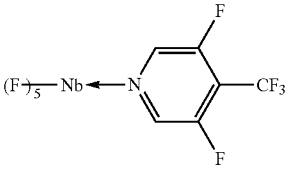
Formula 126
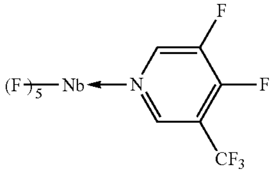
Formula 127
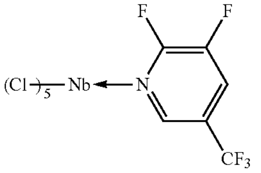
Formula 128
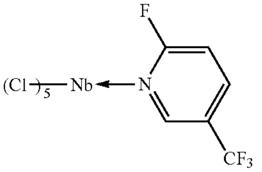
-continued
Formula 129
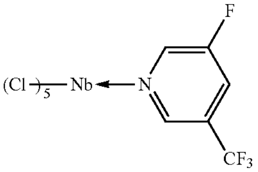
Formula 130
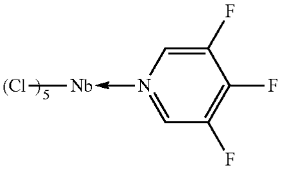
Formula 131
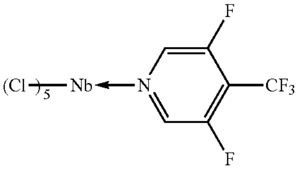
Formula 132
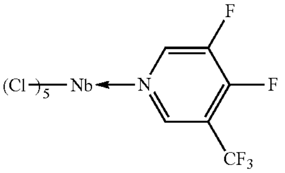
Formula 133
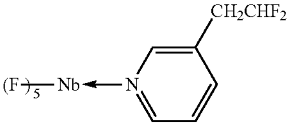
Formula 134
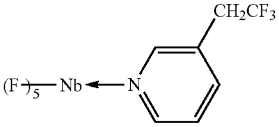
Formula 135
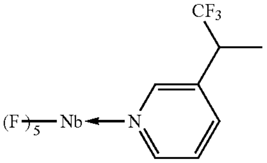
Formula 136
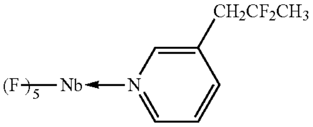
Formula 137
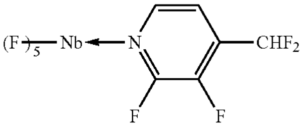
Formula 138
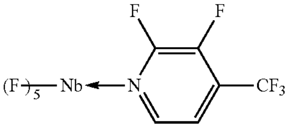

-continued
Formula 139
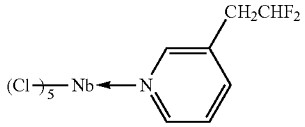
Formula 140
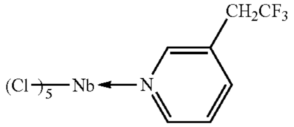
Formula 141
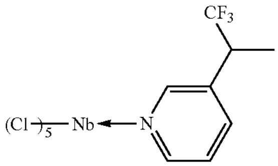
Formula 142
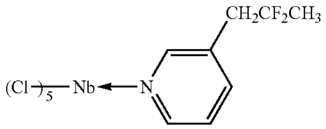
Formula 143
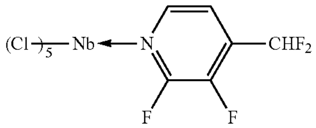
Formula 144
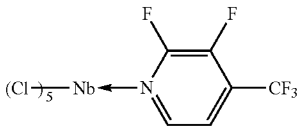
Formula 145
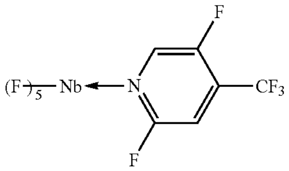
Formula 146
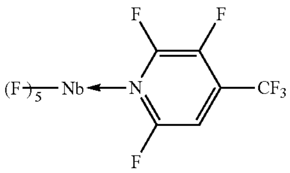
Formula 147
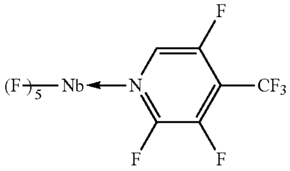
Formula 148
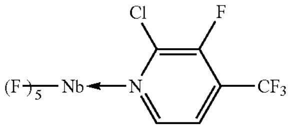
-continued
Formula 149
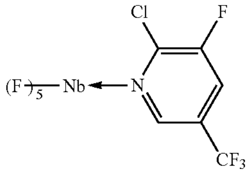
Formula 150
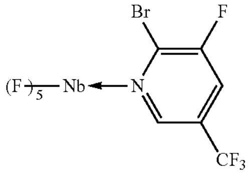
Formula 151
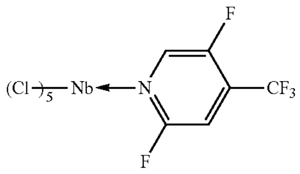
Formula 152
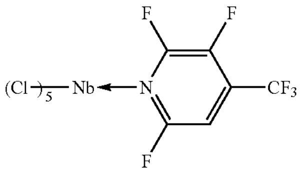
Formula 153
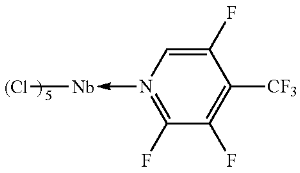
Formula 154
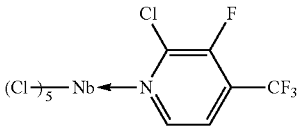
Formula 155
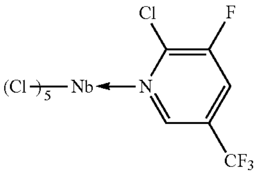
Formula 156
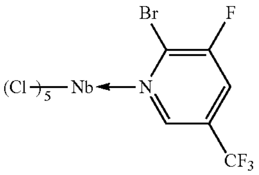
Formula 157
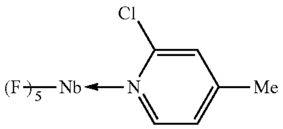

-continued
Formula 158
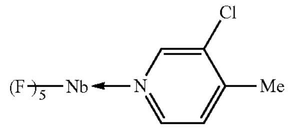
Formula 159
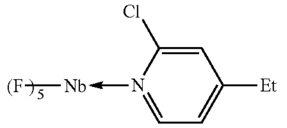
Formula 160
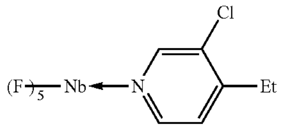
Formula 161
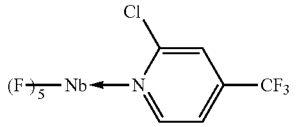
Formula 162
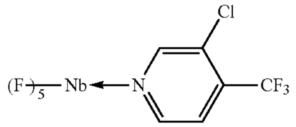
Formula 163
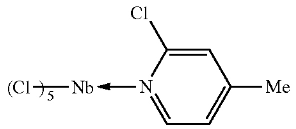
Formula 164
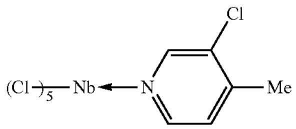
Formula 165
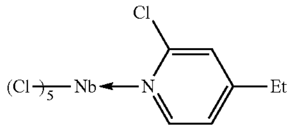
Formula 166
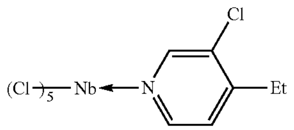
Formula 167
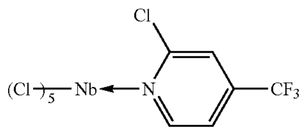
Formula 168
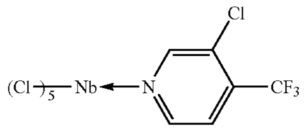
-continued
Formula 169
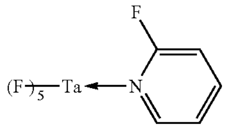
Formula 170
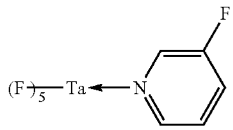
Formula 171
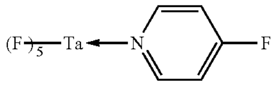
Formula 172
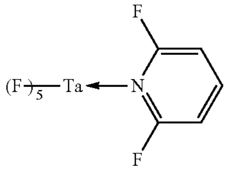
Formula 173
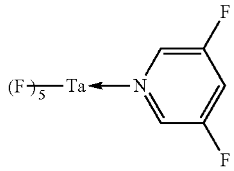
Formula 174
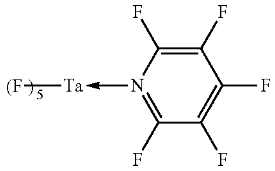
Formula 175
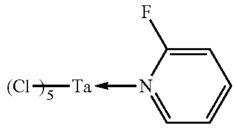
Formula 176
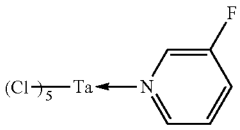
Formula 177
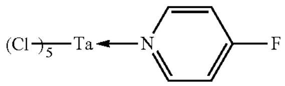
Formula 178
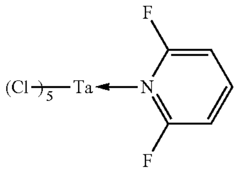

-continued
Formula 179
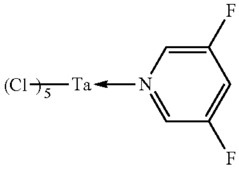
Formula 180
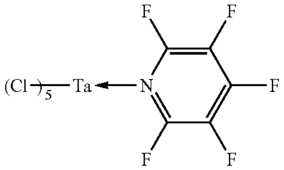
Formula 181
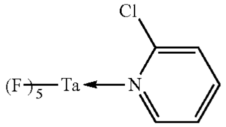
Formula 182
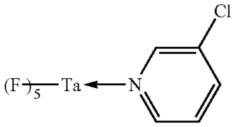
Formula 183
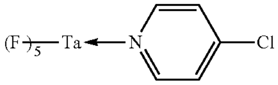
Formula 184
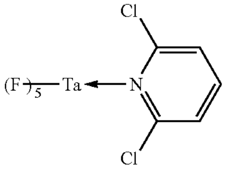
Formula 185
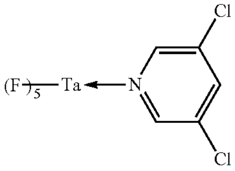
Formula 186
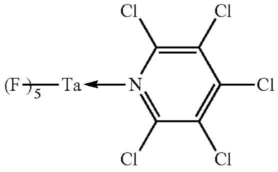
Formula 187
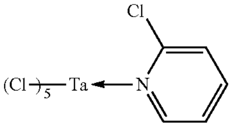
Formula 188
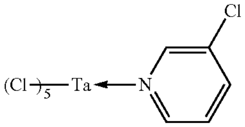
-continued
Formula 189
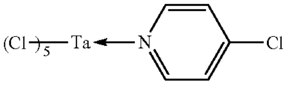
Formula 190
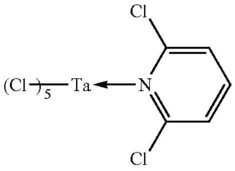
Formula 191
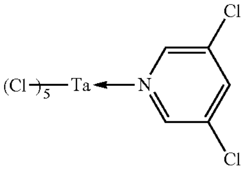
Formula 192
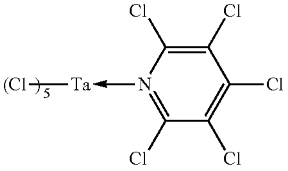
Formula 193
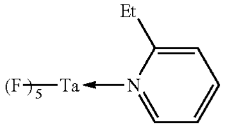
Formula 194
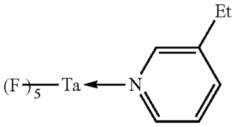
Formula 195
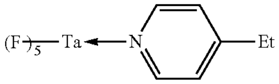
Formula 196
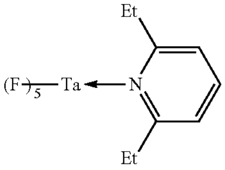
Formula 197
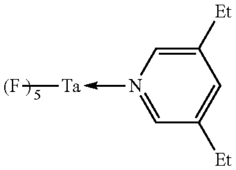
Formula 198
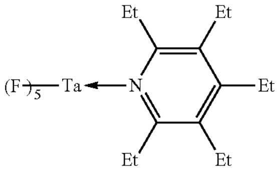

-continued
Formula 199
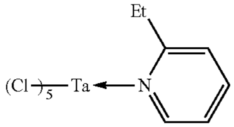
Formula 200
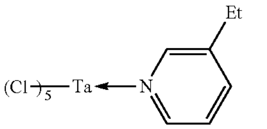
Formula 201
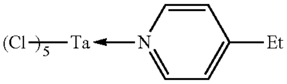
Formula 202
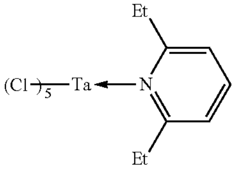
Formula 203
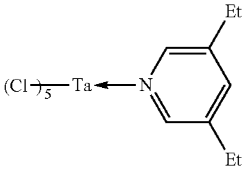
Formula 204
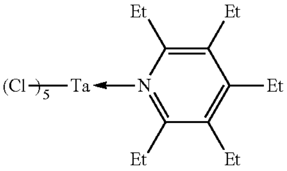
Formula 205
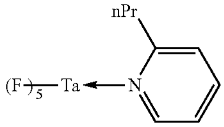
Formula 206
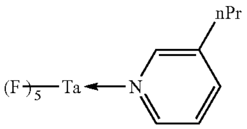
Formula 207
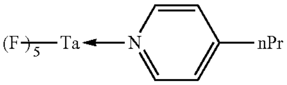
Formula 208
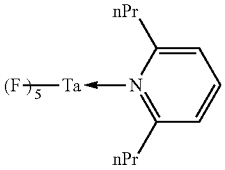
-continued
Formula 209
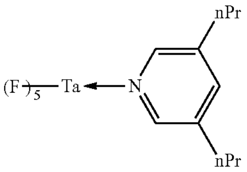
Formula 210
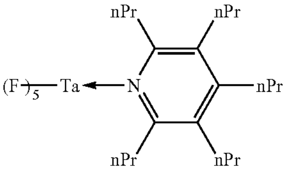
Formula 211
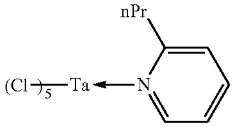
Formula 212
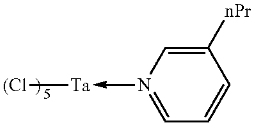
Formula 213
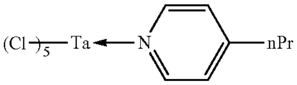
Formula 214
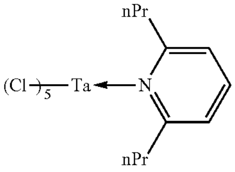
Formula 215
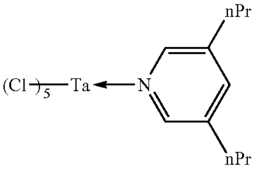
Formula 216
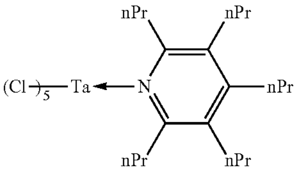
Formula 217
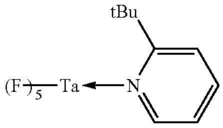
Formula 218
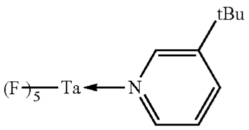

-continued
Formula 219
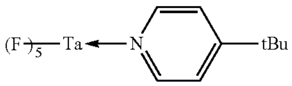
Formula 220
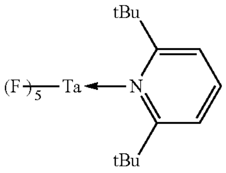
Formula 221
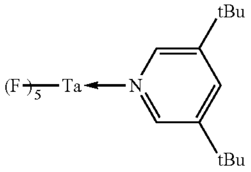
Formula 222
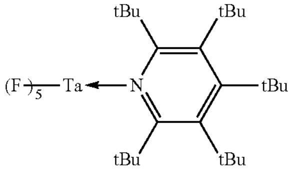
Formula 223
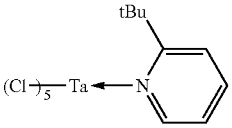
Formula 224
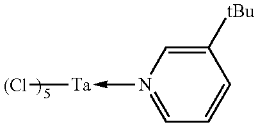
Formula 225
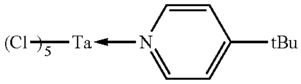
Formula 226
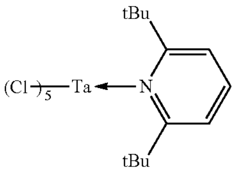
Formula 227
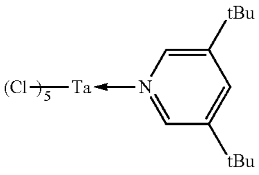
Formula 228
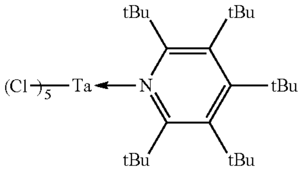
-continued
Formula 229
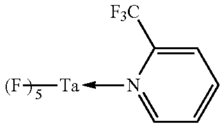
Formula 230
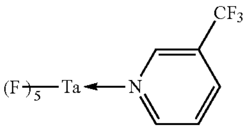
Formula 231
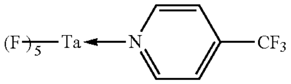
Formula 232
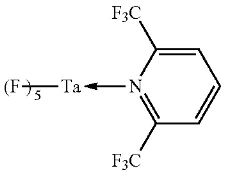
Formula 233
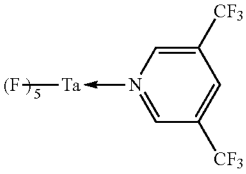
Formula 234
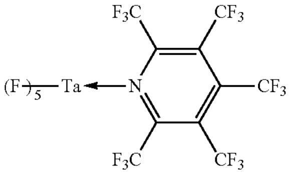
Formula 235
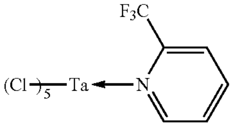
Formula 236
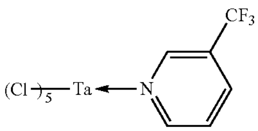
Formula 237
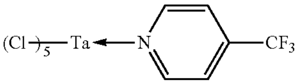
Formula 238
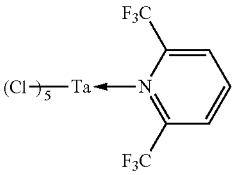

-continued
Formula 239
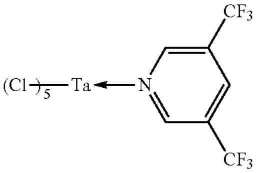
Formula 240
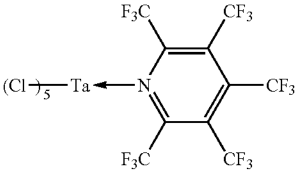
Formula 241
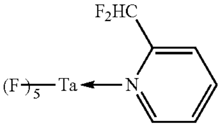
Formula 242
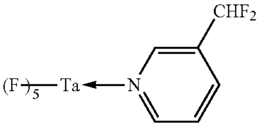
Formula 243
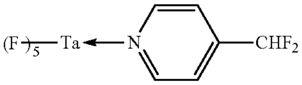
Formula 244
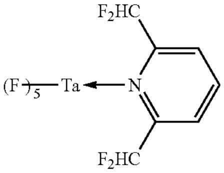
Formula 245
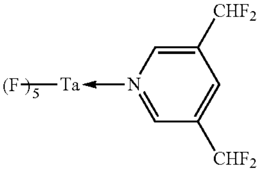
Formula 246
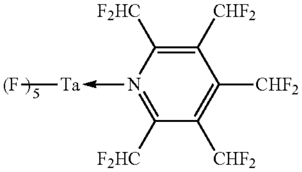
Formula 247
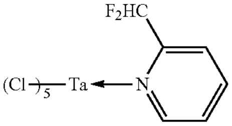
Formula 248
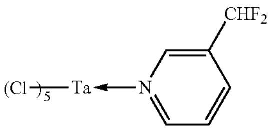
-continued
Formula 249
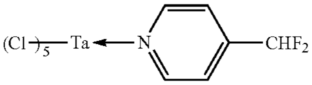
Formula 250
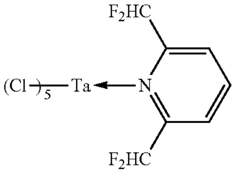
Formula 251
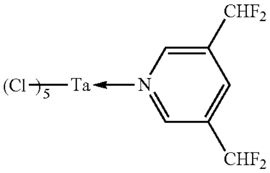
Formula 252
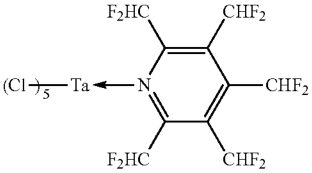
Formula 253
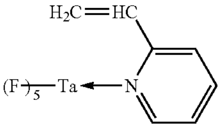
Formula 254
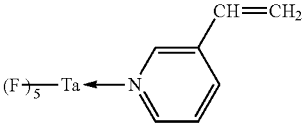
Formula 255
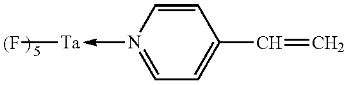
Formula 256
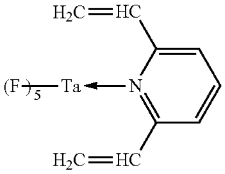
Formula 257
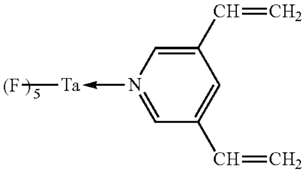
Formula 258
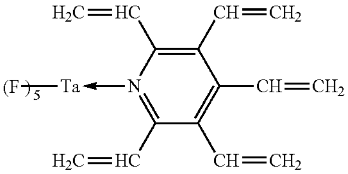

-continued
Formula 259
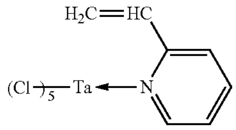
Formula 260
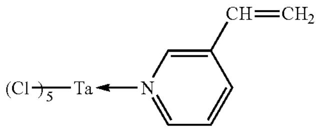
Formula 261
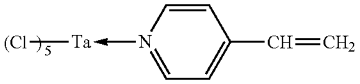
Formula 262
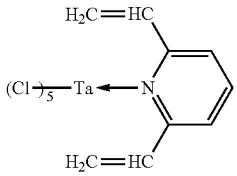
Formula 263
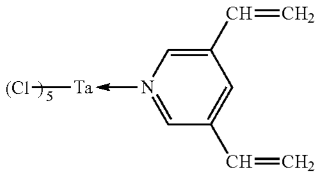
Formula 264
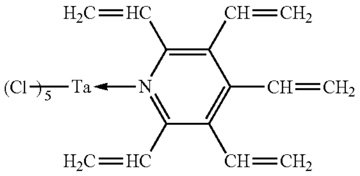
Formula 265
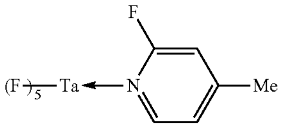
Formula 266
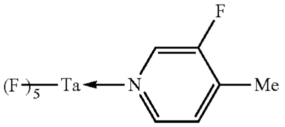
Formula 267
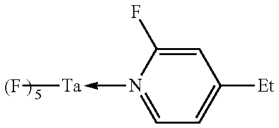
Formula 268
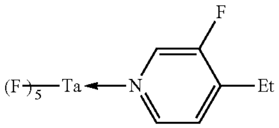
Formula 269
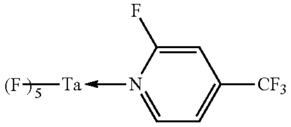
-continued
Formula 270
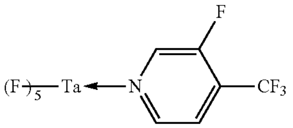
Formula 271
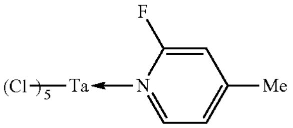
Formula 272
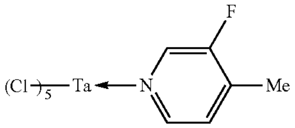
Formula 273
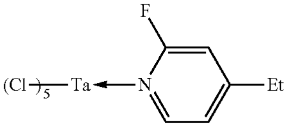
Formula 274
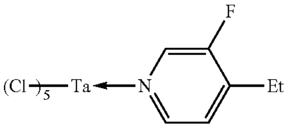
Formula 275
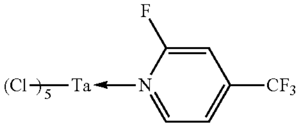
Formula 276
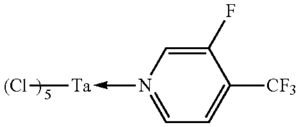
Formula 277
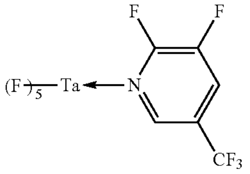
Formula 278
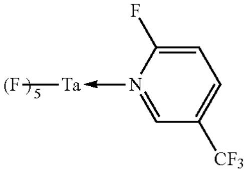
Formula 279
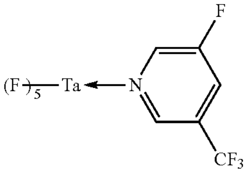

-continued
Formula 280
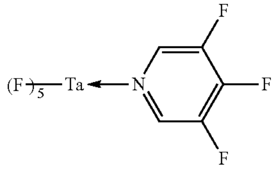
Formula 281
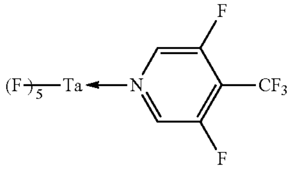
Formula 282
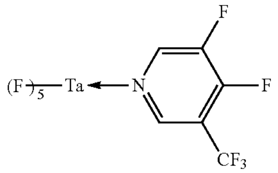
Formula 283
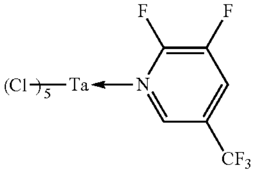
Formula 284
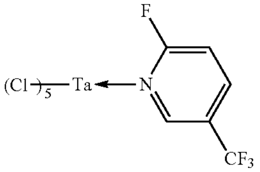
Formula 285
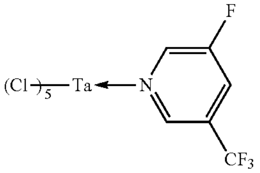
Formula 286
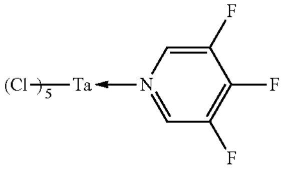
Formula 287
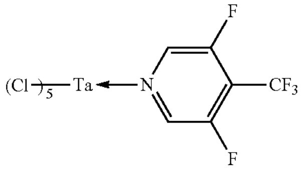
-continued
Formula 288
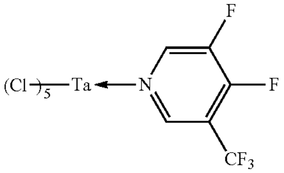
Formula 289
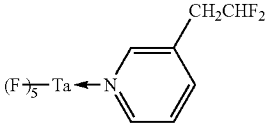
Formula 290
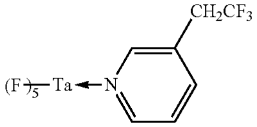
Formula 291
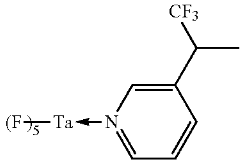
Formula 292
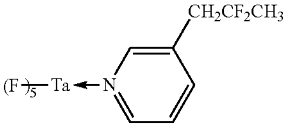
Formula 293
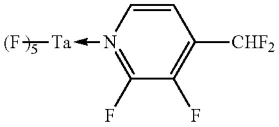
Formula 294
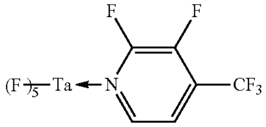
Formula 295
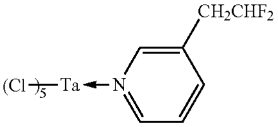
Formula 296
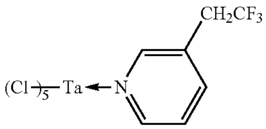
Formula 297
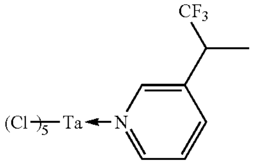

-continued
Formula 298
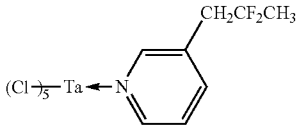
Formula 299
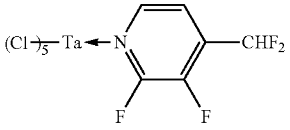
Formula 300
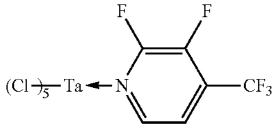
Formula 301
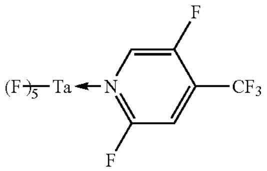
Formula 302
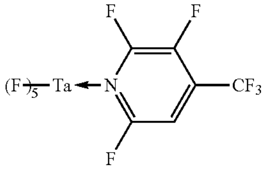
Formula 303
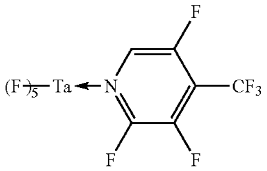
Formula 304
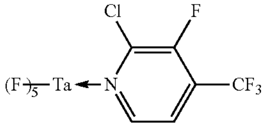
Formula 305
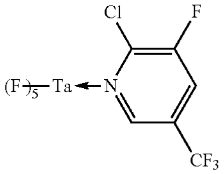
Formula 306
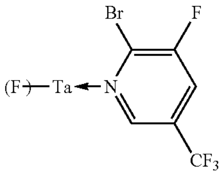
-continued
Formula 307
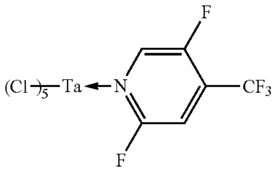
Formula 308
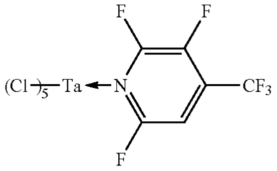
Formula 309
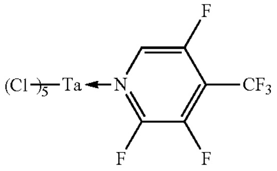
Formula 310
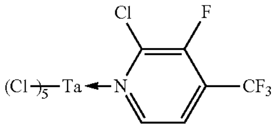
Formula 311
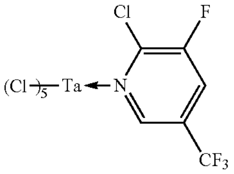
Formula 312
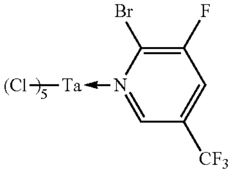
Formula 313
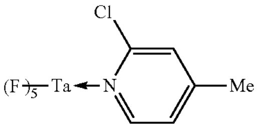
Formula 314
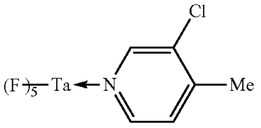
Formula 315
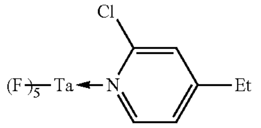
Formula 316
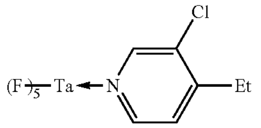

-continued
Formula 317
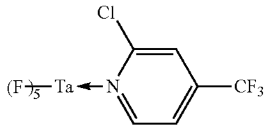
Formula 318
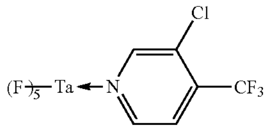
Formula 319
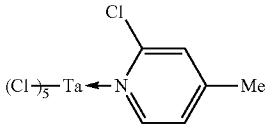
Formula 320
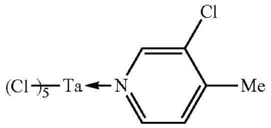
Formula 321
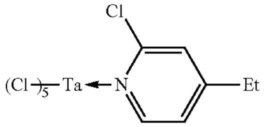
Formula 322
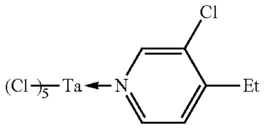
Formula 323
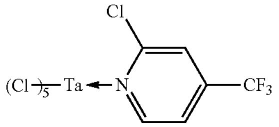
Formula 324
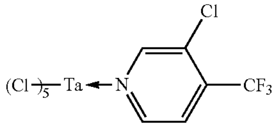
Formula 325
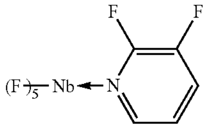
Formula 326
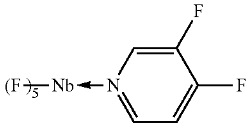
Formula 327
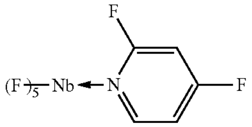
-continued
Formula 328
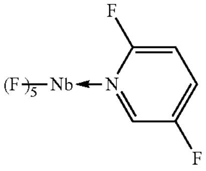
Formula 329
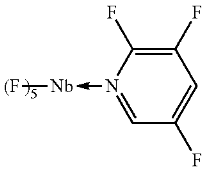
Formula 330
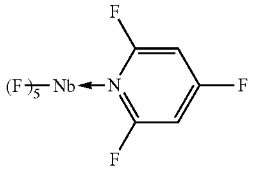
Formula 331
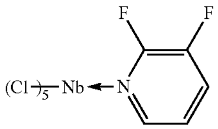
Formula 332
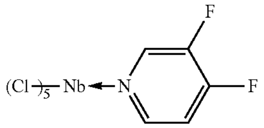
Formula 333
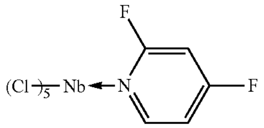
Formula 334
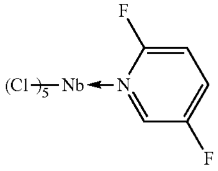
Formula 335
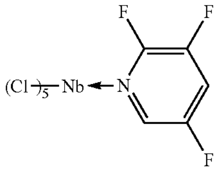
Formula 336
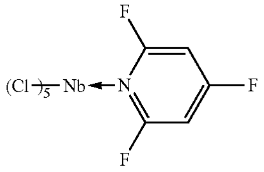
Formula 337
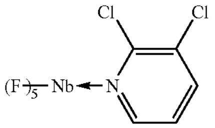

-continued
Formula 338
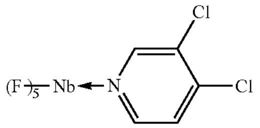
Formula 339
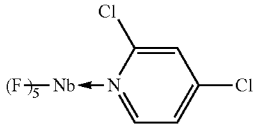
Formula 340
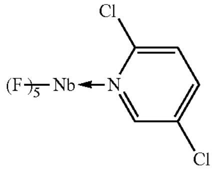
Formula 341
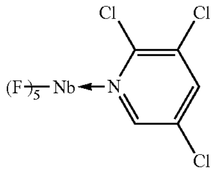
Formula 342
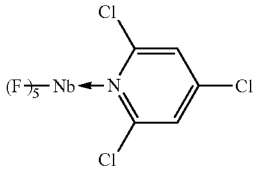
Formula 343
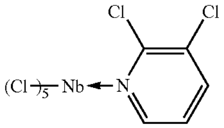
Formula 344
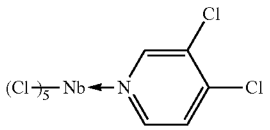
Formula 345
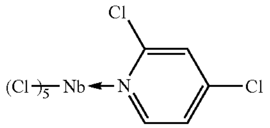
Formula 346
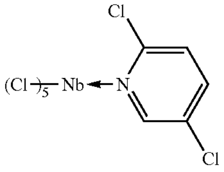
Formula 347
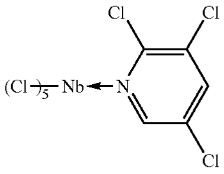
-continued
Formula 348
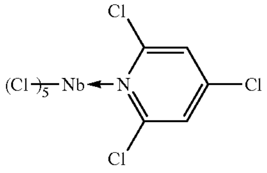
Formula 349
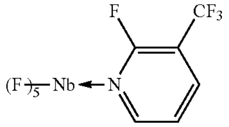
Formula 350
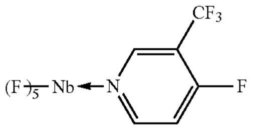
Formula 351
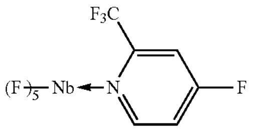
Formula 352
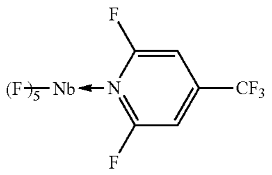
Formula 353
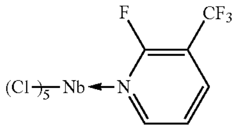
Formula 354
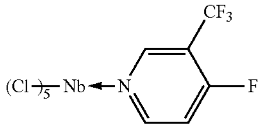
Formula 355
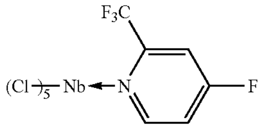
Formula 356
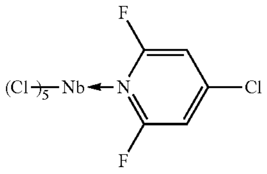
Formula 357
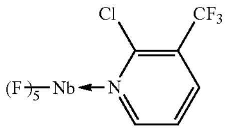

-continued
Formula 358
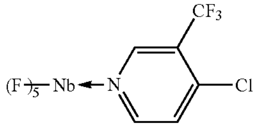
Formula 359
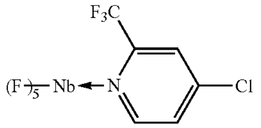
Formula 360
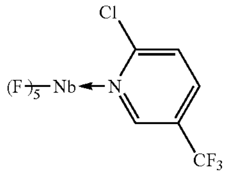
Formula 361
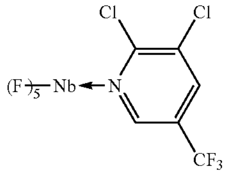
Formula 362
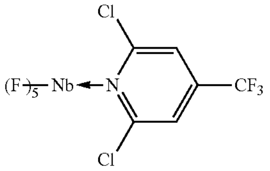
Formula 363
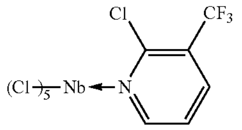
Formula 364
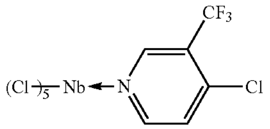
Formula 365
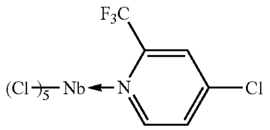
Formula 366
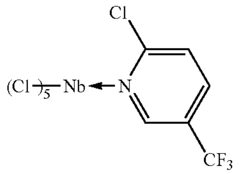
Formula 367
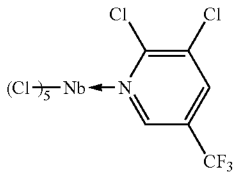
-continued
Formula 368
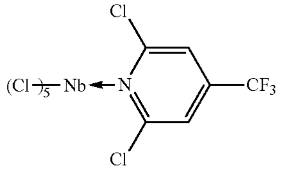
Formula 369
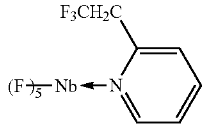
Formula 370
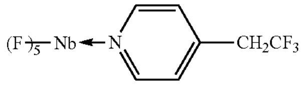
Formula 371
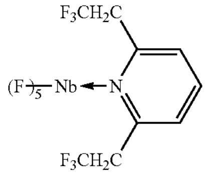
Formula 372
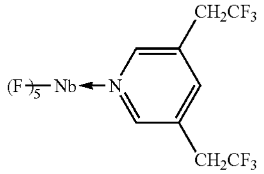
Formula 373
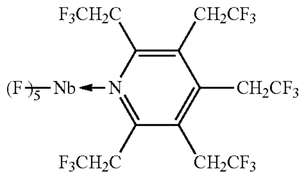
Formula 374
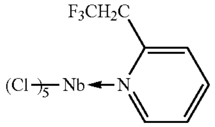
Formula 375
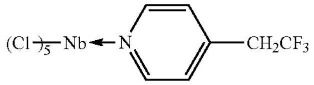
Formula 376
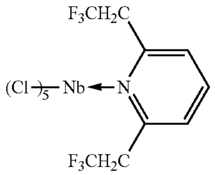
Formula 377
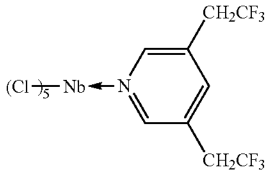

-continued
Formula 378
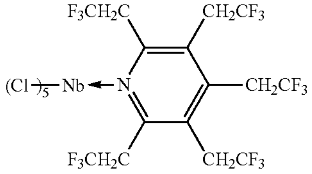
Formula 379
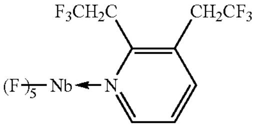
Formula 380
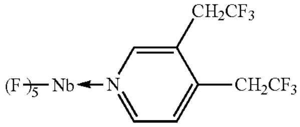
Formula 381
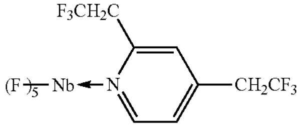
Formula 382
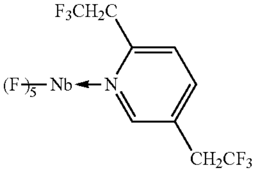
Formula 383
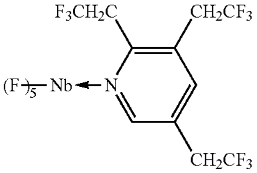
Formula 384
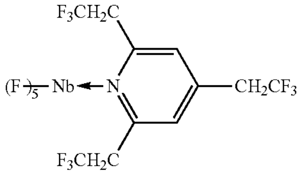
Formula 385
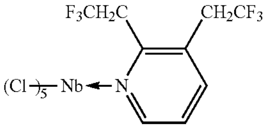
Formula 386
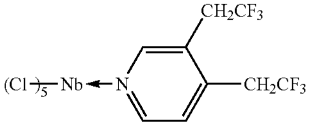
Formula 387
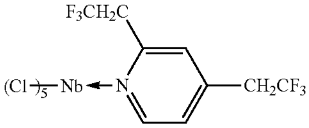
-continued
Formula 388
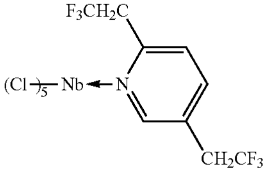
Formula 389
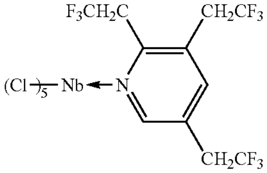
Formula 390
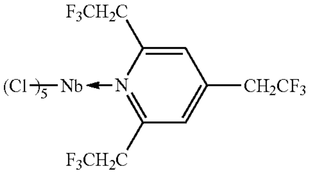
Formula 391
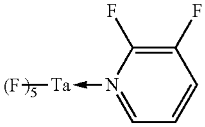
Formula 392
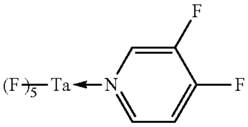
Formula 393
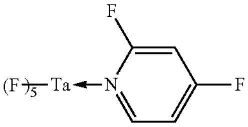
Formula 394
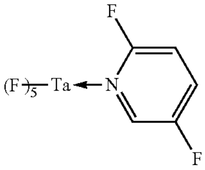
Formula 395
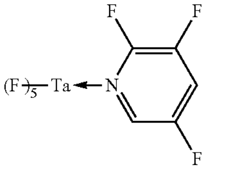
Formula 396
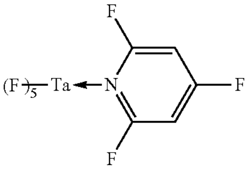

-continued
Formula 397
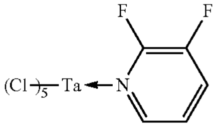
Formula 398
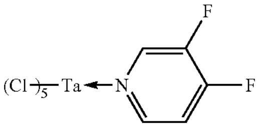
Formula 399
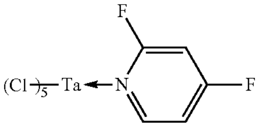
Formula 400
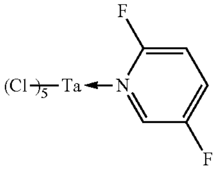
Formula 401
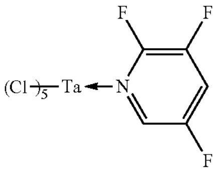
Formula 402
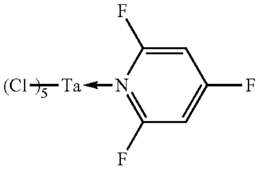
Formula 403
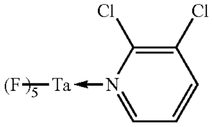
Formula 404
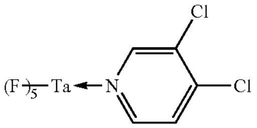
Formula 405
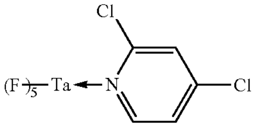
Formula 406
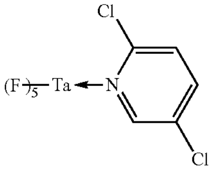
-continued
Formula 407
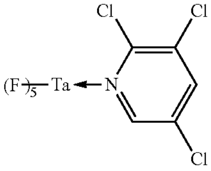
Formula 408
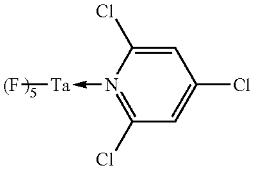
Formula 409
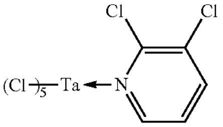
Formula 410
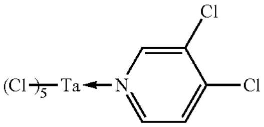
Formula 411
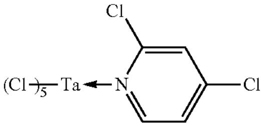
Formula 412
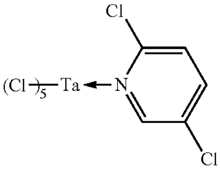
Formula 413
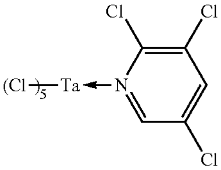
Formula 414
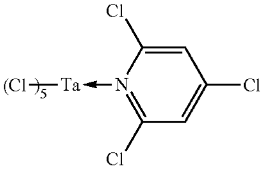
Formula 415
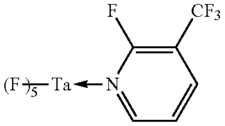
Formula 416
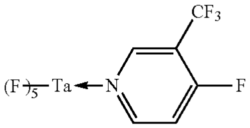

-continued
Formula 417
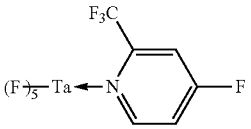
Formula 418
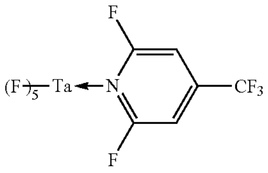
Formula 419
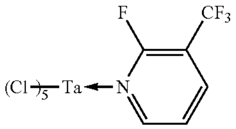
Formula 420
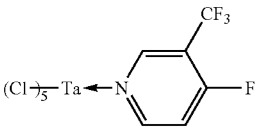
Formula 421
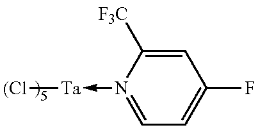
Formula 422
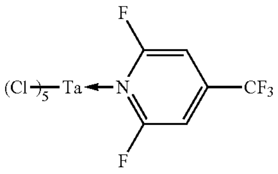
Formula 423
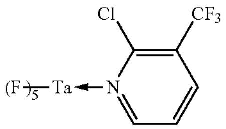
Formula 424
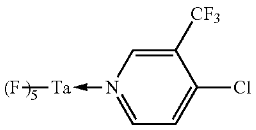
Formula 425
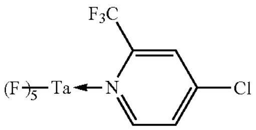
Formula 426
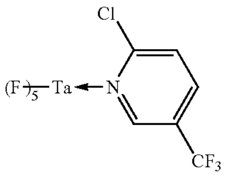
-continued
Formula 427
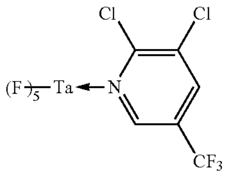
Formula 428
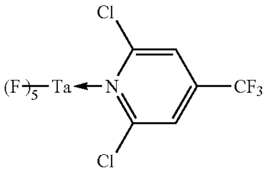
Formula 429
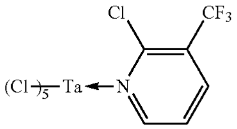
Formula 430
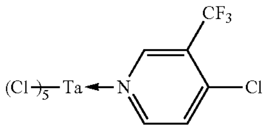
Formula 431
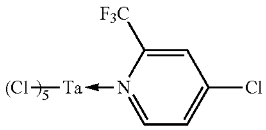
Formula 432
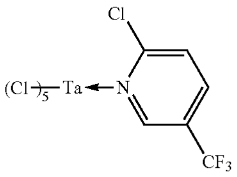
Formula 433
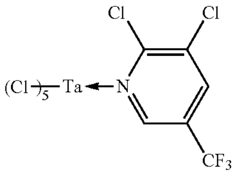
Formula 434
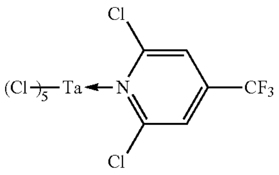
Formula 435
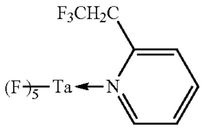
Formula 436
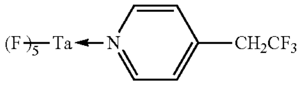

-continued
Formula 437
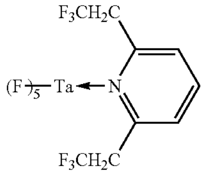
Formula 438
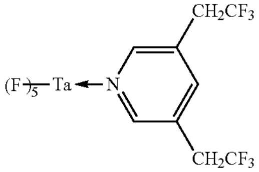
Formula 439
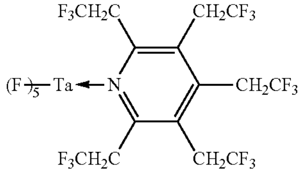
Formula 440
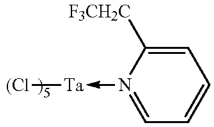
Formula 441
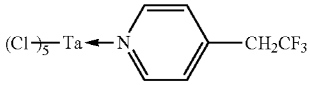
Formula 442
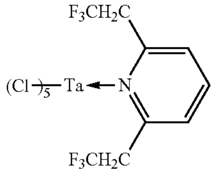
Formula 443
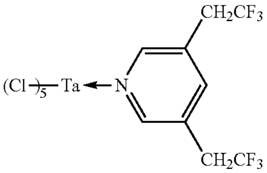
Formula 444
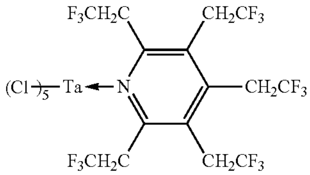
Formula 445
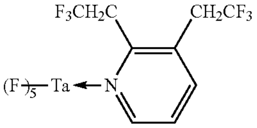
Formula 446
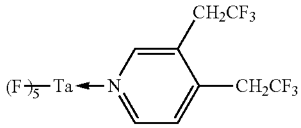
-continued
Formula 447
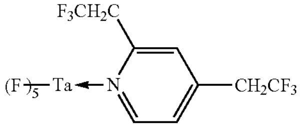
Formula 448
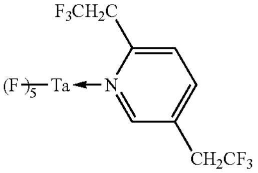
Formula 449
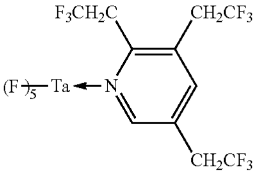
Formula 450
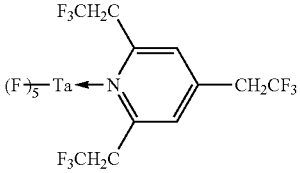
Formula 451
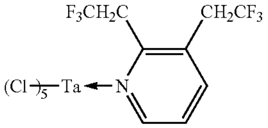
Formula 452
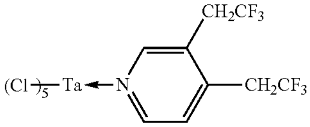
Formula 453
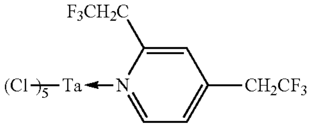
Formula 454
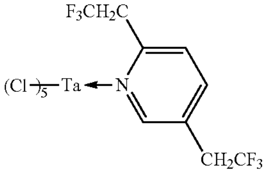
Formula 455
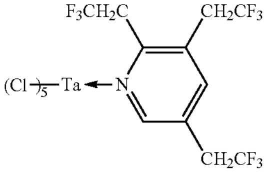

-continued

Formula 456

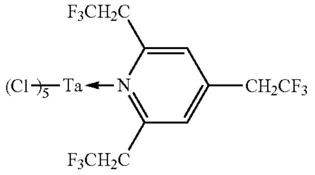

The organometallic adduct compounds according to embodiments may be synthesized by using suitable reactions. In an implementation, $NbF_5$(V), $NbCl_5$(V), $TaF_5$(V), or $TaCl_5$(V) may be reacted, in a dichloromethane solvent, with a pyridine compound that has a structure corresponding to a final structure intended to be synthesized, and then, the obtained solution may undergo solvent removal and purification by distillation, thereby obtaining a niobium compound or a tantalum compound, which is represented by General Formula (I).

The organometallic adduct compound according to embodiments may be used as a source material suitable for a CVD process or an ALD process.

FIG. 1 is a flowchart of a method of manufacturing an integrated circuit device, according to embodiments.

Referring to FIG. 1, in a process P10, a substrate may be prepared.

The substrate may include, e.g., silicon, a ceramic, glass, a metal, a metal nitride, or a combination thereof. The ceramic may include, e.g., silicon nitride, titanium nitride, tantalum nitride, titanium oxide, niobium oxide, zirconium oxide, hafnium oxide, lanthanum oxide, or a combination thereof. Each of the metal and the metal nitride may include, e.g., Ti, Ta, Co, Ru, Zr, Hf, La, or a combination thereof. A surface of the substrate may have a flat shape, a spherical shape, a fibrous shape, or a scale-like shape. In an implementation, the surface of the substrate may have a 3-dimensional structure such as a trench structure or the like.

In an implementation, the substrate may have a configuration as described below regarding a substrate 310 with reference to FIG. 4A.

In a process P20 of FIG. 1, a metal-containing film may be formed on the substrate by using a source material for metal-containing film formation, which includes the organometallic adduct compound represented by General Formula (I).

The source material for metal-containing film formation may include the organometallic adduct compound according to an embodiment. In an implementation, the source material for metal-containing film formation may include at least one of the organometallic adduct compounds represented by, e.g., Formulae 1 to 324.

The source material for metal-containing film formation may vary with a thin film intended to be formed. In an implementation, the metal-containing film intended to be formed may include a niobium-containing film or a tantalum-containing film. When the niobium-containing film is formed, the organometallic adduct compound according to General Formula (I), in which M is a niobium atom, may be used as the source material for metal-containing film formation. When the tantalum-containing film is formed, the organometallic adduct compound according to General Formula (I), in which M is a tantalum atom, may be used as the source material for metal-containing film formation.

In an implementation, when the metal-containing film intended to be formed includes only a niobium atom or a tantalum atom as a metal atom, the source material for metal-containing film formation may not include other metal compounds and semimetallic compounds, in addition to a niobium compound or a tantalum compound, which is represented by General Formula (I).

In an implementation, the metal-containing film intended to be formed may further include another metal in addition to niobium or tantalum. In an implementation, when the metal-containing film intended to be formed is a film further including another metal or semimetal in addition to niobium or tantalum, the source material for metal-containing film formation may include a compound (referred to as "another precursor" hereinafter) including the desired metal or semimetal in addition to the organometallic adduct compound according to an embodiment. In an implementation, the source material for metal-containing film formation may further include an organic solvent or a nucleophilic reagent in addition to the organometallic adduct compound according to an embodiment.

To form the metal-containing film according to the process P20 of FIG. 1, a CVD process or an ALD process may be used. The source material for metal-containing film formation, which includes the organometallic adduct compound according to an embodiment, may be suitably used for a chemical deposition process such as a CVD process or an ALD process.

When the source material for metal-containing film formation is used for a chemical vapor deposition process, a composition of the source material for metal-containing film formation may be appropriately selected according to a transport method of the source material. The transport method of the source material may include, e.g., a vapor transport method or a liquid transport method. In the vapor transport method, the source material for metal-containing film formation may make a vapor state by vaporizing the source material through heating or decompression of the source material within a container (which may be referred to as "source material container" hereinafter) in which the source material is stored, and the source material in a vapor state, together with a carrier gas such as argon, nitrogen, helium, or the like used as needed, may be introduced into a chamber (which may be referred to as "deposition reaction unit" hereinafter) in which the substrate is arranged. In the liquid transport method, the source material may be transported, in a liquid or solution state, to a vaporization chamber and make a vapor by heating and/or compression thereof in the vaporization chamber, and then, the vapor may be introduced into the chamber.

When the vapor transport method is used to form the metal-containing film according to the process P20 of FIG. 1, the organometallic adduct compound itself represented by General Formula (I) may be used as the source material for metal-containing film formation. When the liquid transport method is used to form the metal-containing film according to the process P20 of FIG. 1, the organometallic adduct compound itself represented by General Formula (I), or a solution in which the organometallic adduct compound represented by General Formula (I) is dissolved in an organic solvent may be used as the source material for metal-containing film formation. The source material for metal-containing film formation may further include another precursor, a nucleophilic reagent, or the like.

In an implementation, to form the metal-containing film in accordance with the method of manufacturing an integrated circuit device according to an embodiment, a multi-component chemical deposition method may be used. In the multi-component chemical deposition method, a method (which may be referred to as "single source method" hereinafter) in which each component of the source material for metal-containing film formation is independently vaporized and supplied, or a method (which may be referred to as "cocktail source method" hereinafter) in which a mixed source material obtained by mixing multiple components in a desired composition in advance, may be used. When the cocktail source method is used, a mixture of the organometallic adduct compound according to an embodiment and the other precursor, or a mixed solution in which the mixture is dissolved in an organic solvent may be used as the source material for metal-containing film formation. The mixture or the mixed solution may further include a nucleophilic reagent.

The organic solvent may include a suitable organic solvent. In an implementation, the organic solvent may include, e.g., acetic acid esters such as ethyl acetate, butyl acetate, or methoxyethyl acetate; ethers such as tetrahydrofuran, tetrahydropyran, (ethylene glycol dimethyl ether, triethylene glycol dimethyl ether, or dibutyl ether; ketones such as methyl butyl ketone, methyl isobutyl ketone, ethyl butyl ketone, dipropyl ketone, diisobutyl ketone, methyl amyl ketone, cyclohexanone, or methyl cyclohexanone; hydrocarbons such as hexane, cyclohexane, methylcyclohexane, dimethylcyclohexane, ethylcyclohexane, heptane, octane, toluene, or xylene; cyano group-containing hydrocarbons such as 1-cyanopropane, 1-cyanobutane, 1-cyanohexane, cyanocyclohexane, cyanobenzene, 1,3-dicyanopropane, 1,4-dicyanobutane, 1,6-dicyanohexane, 1,4-dicyanocyclohexane, or 1,4-dicyanobenzene; pyridine; lutidine; or the like. The organic solvents set forth above as examples may be used alone or as a mixed solvent of at least two thereof, by considering solubility of solutes, use temperatures and boiling points thereof, flash points thereof, or the like.

When the organic solvent is included in the source material for metal-containing film formation, which includes the organometallic adduct compound according to an embodiment, the organometallic adduct compound and the other precursor may be present, in the organic solvent, in a total amount of about 0.01 mol/L to about 2.0 mol/L, for example, about 0.05 mol/L to about 1.0 mol/L. In an implementation, when the source material for metal-containing film formation does not include other metal compounds or semimetal compounds in addition to the organometallic adduct compound according to an embodiment, the total amount set forth above is an amount of the organometallic adduct compound, and when the source material for metal-containing film formation includes another metal compound or semimetal compound, e.g., the other precursor, in addition to the organometallic adduct compound according to an embodiment, the total amount set forth above is a sum of the amount of the organometallic adduct compound and an amount of the other precursor.

When the multi-component chemical deposition method is used to form the metal-containing film in accordance with the method of manufacturing an integrated circuit device, the other precursor capable of being used together with the organometallic adduct compound according to an embodiment may include other suitable precursors that are in use as source materials for metal-containing film formation.

In an implementation, the other precursor, which may be used to form the metal-containing film in accordance with the method of manufacturing an integrated circuit device, may include a organic coordination compound, e.g., an alcohol compound, a glycol compound, a β-diketone compound, a cyclopentadiene compound, an organic amine compound, a silicon compound, or a metal compound.

The other precursor may include an element, e.g., lithium (Li), sodium (Na), potassium (K), magnesium (Mg), calcium (Ca), strontium (Sr), barium (Ba), titanium (Ti), zirconium (Zr), hafnium (Hf), vanadium (V), chromium (Cr), molybdenum (Mo), tungsten (W), manganese (Mn), iron (Fe), cobalt (Co), rhodium (Rh), iridium (Ir), nickel (Ni), platinum (Pt), copper (Cu), silver (Ag), gold (Au), zinc (Zn), aluminum (Al), germanium (Ge), tin (Sn), lead (Pb), antimony (Sb), bismuth (Bi), yttrium (Y), lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), ruthenium (Ru), or lutetium (Lu).

Examples of the alcohol compound having an organic ligand of the other precursor may include alkyl alcohols such as methanol, ethanol, propanol, isopropyl alcohol, butanol, sec-butyl alcohol, isobutyl alcohol, tert-butyl alcohol, pentyl alcohol, isopentyl alcohol, and tert-pentyl alcohol; ether alcohols such as 2-methoxyethanol, 2-ethoxyethanol, 2-butoxyethanol, 2-(2-methoxyethoxy)ethanol, 2-methoxy-1-methylethanol, 2-methoxy-1,1-dimethylethanol, 2-ethoxy-1,1-dimethylethanol, 2-isopropoxy-1,1-dimethylethanol, 2-butoxy-1,1-dimethylethanol, 2-(2-methoxyethoxy)-1,1-dimethylethanol, 2-propoxy-1,1-diethylethanol, 2-sec-butoxy-1,1-diethylethanol, and 3-methoxy-1,1-dimethylpropanol; and dialakylaminoalcohols such as dimethylaminoethanol, ethylmethylaminoethanol, diethylaminoethanol, dimethylamino-2-pentanol, ethylmethylamino-2-pentanol, dimethylamino-2-methyl-2-pentanol, ethylmethylamino-2-methyl-2-pentanol, and diethylamino-2-methyl-2-pentanol.

Examples of the glycol compound capable of being used as the organic coordination compound of the other precursor may include 1,2-ethanediol, 1,2-propanediol, 1,3-propanediol, 2,4-hexanediol, 2,2-dimethyl-1,3-propanediol, 2,2-diethyl-1,3-propanediol, 1,3-butanediol, 2,4-butanediol, 2,2-diethyl-1,3-butanediol, 2-ethyl-2-butyl-1,3-propanediol, 2,4-pentanediol, 2-methyl-1,3-propanediol, 2-methyl-2,4-pentanediol, 2,4-hexanediol, and 2,4-dimethyl-2,4-pentanediol.

Examples of the β-diketone compound capable of being used as the organic coordination compound of the other precursor may include alkyl-substituted β-diketones such as acetylacetone, hexane-2,4-dione, 5-methylhexane-2,4-dione, heptane-2,4-dione, 2-methylheptane-3,5-dione, 5-methylheptane-2,4-dione, 6-methylheptane-2,4-dione, 2,2-dimethylheptane-3,5-dione, 2,6-dimethylheptane-3,5-dione, 2,2,6-trimethylheptane-3,5-dione, 2,2,6,6-tetramethylheptane-3,5-dione, octane-2,4-dione, 2,2,6-trimethyloctane-3,5-dione, 2,6-dimethyloctane-3,5-dione, 2,9-dimethylnonane-4,6-dione, 2-methyl-6-ethyldecane-3,5-dione, and 2,2-dimethyl-6-ethyldecane-3,5-dione; fluorine-substituted alkyl β-diketones such as 1,1,1-trifluoropentane-2,4-dione, 1,1,1-trifluoro-5,5-dimethylhexane-2,4-dione, 1,1,1,5,5,5-hexafluoropentane-2,4-dione, and 1,3-diperfluorohexylpropane-1,3-dione; and ether-substituted β-diketones such as 1,1,5,5-tetramethyl-1-methoxyhexane-2,4-dione, 2,2,6,6-tetramethyl-1-methoxyheptane-3,5-dione, and 2,2,6,6-tetramethyl-1-(2-methoxyethoxy)heptane-3,5-dione.

Examples of the cyclopentadiene compound capable of being used as the organic coordination compound of the other precursor may include cyclopentadiene, methylcyclopentadiene, ethylcyclopentadiene, propylcyclopentadiene, isopropylcyclopentadiene, butylcyclopentadiene, sec-butylcyclopentadiene, isobutylcyclopentadiene, tert-butylcyclepentadiene, dimethylcyclopentadiene, and tetramethylcyclopentadiene.

Examples of the organic amine compound capable of being used as the organic coordination compound of the other precursor may include methylamine, ethylamine, propylamine, isopropylamine, butylamine, sec-butylamine, tert-butylamine, isobutylamine, dimethylamine, diethylamine, dipropylamine, diisopropylamine, ethylmethylamine, propylmethylamine, and isopropylmethylamine.

The other precursor may be a suitable precursor, and a suitable method may be used to manufacture the other precursor. In an implementation, when the alcohol compound is used as the organic ligand, the precursor may be manufactured by reacting an inorganic salt of the above-described element or a hydrate thereof with an alkaline metal alkoxide of the alcohol compound. Examples of the inorganic salt of the above-described element or the hydrate thereof may include halides of metals, acetic acid, and the like. Examples of the alkaline metal alkoxide may include sodium alkoxides, lithium alkoxides, potassium alkoxides, and the like.

When the single source method is used, a compound having thermal and/or oxidative decomposition behaviors similar to those of the organometallic adduct compound according to an embodiment may be used as the other precursor. When the cocktail source method is used, a compound, which has thermal and/or oxidative decomposition behaviors similar to those of the organometallic adduct compound according to an embodiment and is not deteriorated by a chemical reaction or the like in mixing, may be used as the other precursor.

In forming the metal-containing film in accordance with the method of manufacturing an integrated circuit device according to an embodiment, the source material for metal-containing film formation may include a nucleophilic reagent. The nucleophilic reagent may impart stability to the niobium compound or the tantalum compound according to an embodiment, and/or the other precursor. The nucleophilic reagent may include, e.g., ethylene glycol ethers such as glyme, diglyme, or triglyme, tetraglyme; crown ethers such as 18-crown-6, dicyclohexyl-18-crown-6,24-crown-8, dicyclohexyl-24-crown-8, or dibenzo-24-crown-8; polyamines such as ethylenediamine, N,N'-tetramethylethylenediamine, diethylenetriamine, triethylenetetramine, tetraethylenepentamine, pentaethylenehexamine, 1,1,4,7,7-pentamethyldiethylenetriamine, 1,1,4,7,10,10-hexamethyltriethylenetetramine, or triethoxytriethyleneamine; cyclic polyamines such as cyclam or cyclen; heterocyclic compounds such as pyridine, pyrrolidine, piperidine, morpholine, N-methylpyrrolidine, N-methylpiperidine, N-methylmorpholine, tetrahydrofuran, tetrahydropyran, 1,4-dioxane, oxazole, thiazole, or oxathiolane; β-ketone esters such as methyl acetoacetate, ethyl acetoacetate, or 2-methoxyethyl acetoacetate; or β-diketones such asacetylacetone, 2,4-hexanedione, 2,4-heptanedione, 3,5-heptanedione, or dipivaloylmethane. The nucleophilic reagent may be present in an amount of about 0.1 mol to about 10 mol, e.g., about 1 mol to about 4 mol, based on 1 mol of a total amount of the precursor.

It may be desirable to suppress amounts of metal element impurities, halogen impurities such as chlorine impurities or the like, and organic impurities as much as possible, in the source material for metal-containing film formation, which is used to form the metal-containing film in accordance with the method of manufacturing an integrated circuit device according to an embodiment. In an implementation, each of the metal element impurities may be present in an amount of about 100 ppb (e.g., by weight) or less in the source material for metal-containing film formation. In an implementation, each of the metal element impurities may be present in an amount of about 10 ppb or less in the metal element impurities, and the metal element impurities may be present in a total amount of about 1 ppm or less, e.g., about 100 ppb or less. In an implementation, when a thin film used as a gate insulating film, a gate conductive film, or a barrier film of a large-scale integrated circuit (LSI) is formed, amounts of alkaline metal elements and alkaline earth metal elements, which affect electrical properties of the obtained thin film, may be made as small as possible. In an implementation, the halogen impurities may be present in an amount of about 100 ppm or less, e.g., about 10 ppm or less or about 1 ppm or less, in the source material for metal-containing film formation.

The organic impurities may be present in a total amount of about 500 ppm or less, e.g., about 50 ppm or less, or about 10 ppm or less, in the source material for metal-containing film formation.

When water is present in the source material for metal-containing film formation, the water could cause the generation of particles in the source material or could cause the generation of particles during the formation of the thin film. In an implementation, the precursor, the organic solvent, and the nucleophilic reagent may undergo water removal in advance before use thereof. Water may be present in an amount of about 10 ppm or less, e.g., about 1 ppm or less, in each of the precursor, the organic solvent, and the nucleophilic reagent.

In forming the metal-containing film in accordance with the method of manufacturing an integrated circuit, to reduce particle contamination in the metal-containing film intended to be formed, an amount of particles in the source material for metal-containing film formation may be minimized. In an implementation, when a particle measurement for a liquid phase is performed by a light scattering type particle detector, particles greater than 0.3 μm may be present in a number of 100 or less in 1 mL of a liquid of the source material for metal-containing film formation, and particles greater than 0.2 μm may be present in a number of 1000 or less, for example, 100 or less, in 1 mL of the liquid thereof.

In the process P20 of FIG. 1, to form the metal-containing film by using the source material for metal-containing film formation, the process P20 may include, e.g., a process of introducing the source material for metal-containing film formation into the deposition reaction unit, in which the substrate is located, through the vaporization of the source material, and then forming a precursor thin film on the substrate by depositing the source material for metal-containing film formation on a surface of the substrate; and a process of forming the metal-containing film including niobium atoms or tantalum atoms on the surface of the substrate by reacting the precursor thin film with a reactive gas.

To introduce the source material for metal-containing film formation into the deposition reaction unit through the vaporization of the source material, the gas transport method, the liquid transport method, the single source method, or the cocktail source method, which is described above, may be used.

The reactive gas is a gas reacting with the precursor thin film. In an implementation, the reactive gas may include, e.g., an oxidizing gas or a nitrifying gas.

The oxidizing gas may include, e.g., $O_2$, $O_3$, $O_2$ plasma, $H_2O$, $NO_2$, NO, $N_2O$ (nitrous oxide), CO, $CO_2$, $H_2O_2$, HCOOH, $CH_3COOH$, $(CH_3CO)_2O$, alcohol, peroxide, sulfur oxide, or a combination thereof.

The nitrifying gas may include, e.g., $NH_3$, $N_2$ plasma, an organic amine compound such as a monoalkylamine, a dialkylamine, a trialkylamine, or an alkylenediamine, a hydrazine compound, or a combination thereof.

In the process P20 of FIG. 1, when a metal oxide film including niobium atoms or tantalum atoms is formed, the oxidizing gas may be used as the reactive gas. In the process P20 of FIG. 1, when a metal nitride film including niobium atoms or tantalum atoms is formed, the nitrifying gas may be used as the reactive gas.

In an implementation, to form the metal-containing film including niobium atoms or tantalum atoms in the process P20 of FIG. 1, a thermal CVD process, in which a thin film is formed by reacting a source gas including the organometallic adduct compound according to an embodiment, or the source gas and the reactive gas only by heat, a plasma CVD process using heat and plasma for the reaction, an optical CVD process using heat and light for the reaction, an optical plasma CVD process using heat, light, and plasma for the reaction, or an ALD process may be used.

In forming the metal-containing film according to the process P20 of FIG. 1, a reaction temperature (substrate temperature), a reaction pressure, a deposition rate, or the like may be appropriately selected according to the thickness and type of the desired metal-containing film. The reaction temperature may be in a range of room or ambient temperature to about 600° C., e.g., about 400° C. to about 550° C., which are sufficient for the reaction of the source material for metal-containing film formation.

In forming the metal-containing film according to the process P20 of FIG. 1, when an ALD process is used, the thickness of the metal-containing film may be adjusted by adjusting the number of cycles of the ALD process. When the metal-containing film is formed on the substrate by using an ALD process, the ALD process may include, e.g., a source material introduction process where a vapor formed by vaporizing the source material for metal-containing film formation, which includes the organometallic adduct compound according to an embodiment, is introduced into the deposition reaction unit; a precursor thin film formation process where a precursor thin film is formed on the surface of the substrate by using the vapor; an exhaust process where an unreacted source gas remaining in a reaction space over the substrate is discharged; and a process of forming the metal-containing film on the surface of the substrate by chemically reacting the precursor thin film with a reactive gas.

In an implementation, the process of vaporizing the source material for metal-containing film formation may be performed in the source material container or in the vaporization chamber. The process of vaporizing the source material for metal-containing film formation may be performed at about 0° C. to about 200° C. When the source material for metal-containing film formation is vaporized, a pressure in the source material container or the vaporization chamber may be about 1 Pa to about 10,000 Pa.

Figure 2:
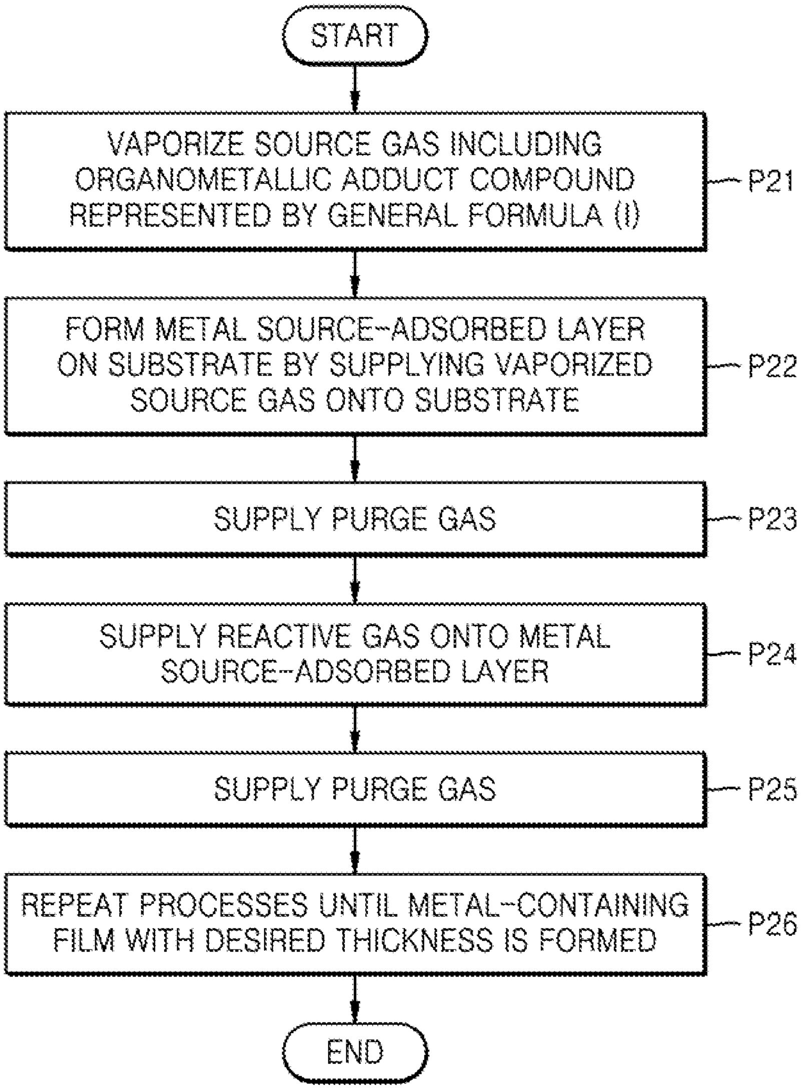
FIG. 2 is a flowchart of an example method of forming a metal-containing film in accordance with a method of manufacturing an integrated circuit device according to embodiments.

FIG. 2 is a flowchart of an example method of forming a metal-containing film in accordance with the method of manufacturing an integrated circuit device, according to embodiments. The method of forming the metal-containing film by an ALD process according to the process P20 of FIG. 1 will be described with reference to FIG. 2.

Referring to FIG. 2, in a process P21, a source gas including an organometallic adduct compound having a structure of General Formula (I) may be vaporized.

In an implementation, the source gas may include the above-described source material for metal-containing film formation. The process of vaporizing the source gas may be performed at about 0° C. to about 200° C. When the source gas is vaporized, the pressure in the source material container or the vaporization chamber may be about 1 Pa to about 10,000 Pa.

In a process P22, a metal source adsorbed layer including niobium atoms or tantalum atoms may be formed on the substrate by supplying the source gas vaporized according to the process P21 onto the substrate. In an implementation, the reaction temperature may be in a range of room temperature to about 600° C., e.g., about 400° C. to about 550° C. The reaction pressure may be about 1 Pa to about 10,000 Pa, e.g., about 10 Pa to about 1,000 Pa.

The adsorbed layer including a chemisorbed layer and a physisorbed layer of the vaporized source gas may be formed on the substrate by supplying the vaporized source gas onto the substrate.

In a process P23, unnecessary byproducts on the substrate may be removed by supplying a purge gas onto the substrate.

The purge gas may include, e.g., an inert gas (such as Ar, He, or Ne), $N_2$ gas, or the like.

In an implementation, exhaustion may be performed by decompressing the reaction space in which the substrate is located, rather than by the purge process. In an implementation, for the decompression, the pressure of the reaction space may be maintained at about 0.01 Pa to about 300 Pa, e.g., about 0.01 Pa to about 100 Pa.

In an implementation, a process of heating the substrate, on which the metal source adsorbed layer including niobium atoms or tantalum atoms is formed, or heat-treating the reaction chamber, in which the substrate is accommodated, may be further performed. The heat treatment may be performed at a temperature of room temperature to about 600° C., e.g., about 400° C. to about 550° C.

In a process P24, a metal-containing film may be formed in units of atomic layers by supplying a reactive gas onto the metal source adsorbed layer formed on the substrate.

In an implementation, a metal oxide film including niobium atoms or tantalum atoms may be formed on the substrate, and the reactive gas may be an oxidizing gas, e.g., $O_2$, $O_3$, $O_2$ plasma, $H_2O$, $NO_2$, NO, $N_2O$ (nitrous oxide), CO, $CO_2$, $H_2O_2$, HCOOH, $CH_3COOH$, $(CH_3CO)_2O$, an alcohol, a peroxide, sulfur oxide, or a combination thereof.

In an implementation, a metal nitride film including niobium atoms or tantalum atoms may be formed on the substrate, and the reactive gas may be, e.g., $NH_3$, $N_2$ plasma, an organic amine compound such as a monoalkylamine, a dialkylamine, a trialkylamine, or an alkylenediamine, a hydrazine compound, and a combination thereof.

During the process P24, the reaction space may be maintained at a temperature of room temperature to about 600° C., e.g., about 400° C. to about 550° C., such that the metal source adsorbed layer including niobium atoms or tantalum atoms may sufficiently react with the reactive gas. During the process P24, the pressure of the reaction space may be about 1 Pa to about 10,000 Pa, e.g., about 10 Pa to about 1,000 Pa.

During the process P24, the reactive gas may be plasma-treated. A radio frequency (RF) output in the plasma treatment may be about 0 W to about 1,500 W, e.g., about 50 W to about 600 W.

In a process P25, unnecessary byproducts on the substrate are removed by supplying a purge gas onto the substrate.

The purge gas may include, e.g., an inert gas (such as Ar, He, or Ne), $N_2$ gas, or the like.

In a process P26, the processes P21 to P25 may be repeated until the metal-containing film with a desired thickness is formed.

A thin film deposition process, which includes a series of processes including the processes P21 to P25, may be defined as one cycle, and the cycle may be repeated a plurality of times until the metal-containing film with a desired thickness is formed. In an implementation, the one cycle is performed, unreacted gases may be discharged from the reaction chamber by performing an exhaust process using a purge gas similarly as in the process P23 or the process P25, and then, a subsequent cycle may be performed.

In an implementation, to help control the deposition rate of the metal-containing film, a source material supply condition (e.g., a vaporization temperature or a vaporization pressure of the source material), the reaction temperature, the reaction pressure, or the like may be controlled. If the deposition rate of the metal-containing film were to be too high, the obtained metal-containing film could have deteriorated properties, and if the deposition rate of the metal-containing film were to be too low, the productivity could be deteriorated. In an implementation, the deposition rate of the metal-containing film may be about 0.01 nm/min to about 100 nm/min, e.g., about 0.1 nm/min to about 50 nm/min.

In process of forming the metal-containing film, various suitable changes and modifications may be made thereto.

In an implementation, to form the metal-containing film on the substrate, the organometallic adduct compound having the structure of General Formula (I), and at least one of the other precursor, the reactive gas, the carrier gas, and the purge gas may be supplied simultaneously or sequentially onto the substrate. More detailed configurations of the other precursor, the reactive gas, the carrier gas, and the purge gas, which may be supplied onto the substrate simultaneously with the organometallic adduct compound having the structure of General Formula (I), are as described above.

In an implementation, in the process of forming the metal-containing film, which is described with reference to FIG. 2, the reactive gas may be supplied onto the substrate between each of the processes P21 to P25.

FIG. 3A to 3D are schematic diagrams of configurations of example deposition apparatuses 200A, 200B, 200C, and 200D, which may be used for the process of forming the metal-containing film in the method of manufacturing an integrated circuit device according to an embodiment.

Each of the deposition apparatuses 200A, 200B, 200C, and 200D shown in FIGS. 3A to 3D may include a fluid transfer unit 210, a thin film formation unit 250, in which a deposition process for forming a thin film on a substrate W by using a process gas supplied from a source material container 212 in the fluid transfer unit 210, and an exhaust system 270 for discharging gases, which may remain after use for reaction in the thin film formation unit 250, or reaction byproducts.

The thin film formation unit 250 may include a reaction chamber 254 including a susceptor 252 that supports the substrate W. A shower head 256 for supplying a gas, which is supplied from the fluid transfer unit 210, onto the substrate W may be mounted in an upper end portion inside the reaction chamber 254.

The fluid transfer unit 210 may include an inflow line 222 for supplying the carrier gas to the source material container 212 from outside each deposition apparatus, and an outflow line 224 for supplying the source compound contained in the source material container 212 to the thin film formation unit 250. Valves V1 and V2 and mass flow controllers (MFCs) M1 and M2 may be respectively mounted on the inflow line 222 and the outflow line 224. The inflow line 222 and the outflow line 224 may be connected to each other via a bypass line 226. A valve V3 may be mounted on the bypass line 226. The valve V3 may be pneumatically operated by an electric motor or other remotely controllable means.

The source compound supplied from the source material container 212 may be supplied into the reaction chamber 254 through an inflow line 266 of the thin film formation unit 250, which is connected to the outflow line 224 of the fluid transfer unit 210. The source compound supplied from the source material container 212, together with the carrier gas supplied through an inflow line 268, may be supplied into the reaction chamber 254, as needed. A valve V4 and an MFC M3 may be mounted on the inflow line 268 through which the carrier gas flows.

The thin film formation unit 250 may include an inflow line 262 for supplying the purge gas into the reaction chamber 254, and an inflow line 264 for supplying the reactive gas into the reaction chamber 254. Valves V5 and V6 and MFCs M4 and M5 may be respectively mounted on the inflow lines 262 and 264.

The used process gas and waste reaction byproducts in the reaction chamber 254 may be discharged to the outside of each deposition apparatus through the exhaust system 270. The exhaust system 270 may include an exhaust line 272 connected to the reaction chamber 254, and a vacuum pump 274 mounted on the exhaust line 272. The vacuum pump 274 may remove the process gas and the waste reaction byproducts, which are discharged from the reaction chamber 254.

A trap 276 may be mounted on the exhaust line 272 at the upstream side of the vacuum pump 274. The trap 276 may capture, e.g., the reaction by-products generated by the process gas which has not completely reacted in the reaction chamber 254, and thus prevent the reaction by-products from flowing into the vacuum pump 274 at the downstream side of the trap 276.

The trap 276 mounted on the exhaust line 272 may capture extraneous matters, such as reaction byproducts generated by reaction between the process gases, and thus allow the extraneous matters not to flow toward the downstream side of the trap 276. The trap 276 may have a configuration capable of being cooled by a cooler or by water cooling.

In addition, a bypass line 278 and an automatic pressure controller 280 may be mounted on the exhaust line 272 at the upstream side of the trap 276. Valves V7 and V8 may be respectively mounted on the bypass line 278 and a portion of the exhaust line 272, which extends parallel to the bypass line 278.

Figure 3A:
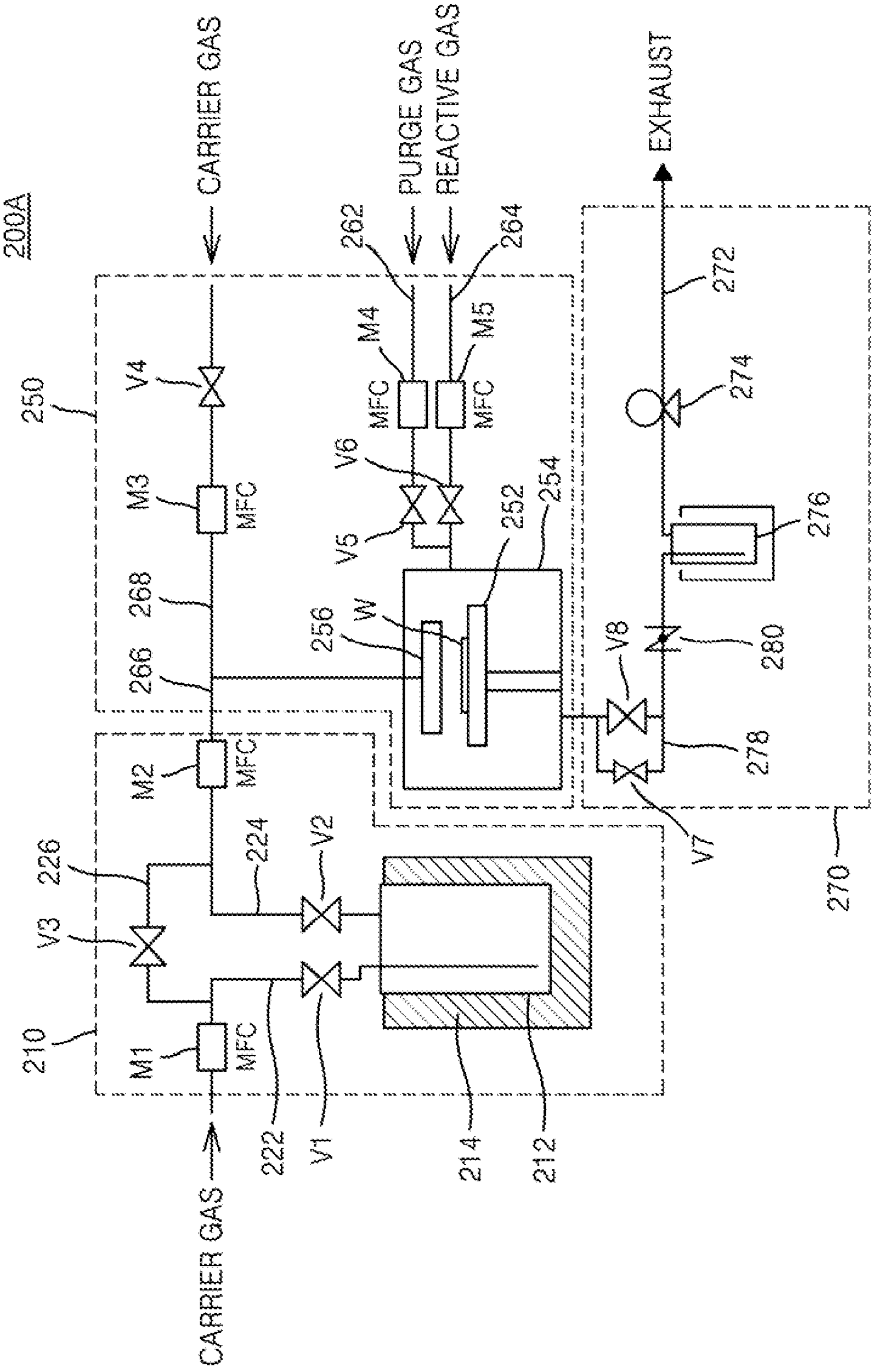
FIGS. 3A to 3D are schematic diagrams of an example configuration of a deposition apparatus, which may be used for a process of forming a metal-containing film in a method of manufacturing an integrated circuit device according to embodiments.
Figure 3B:
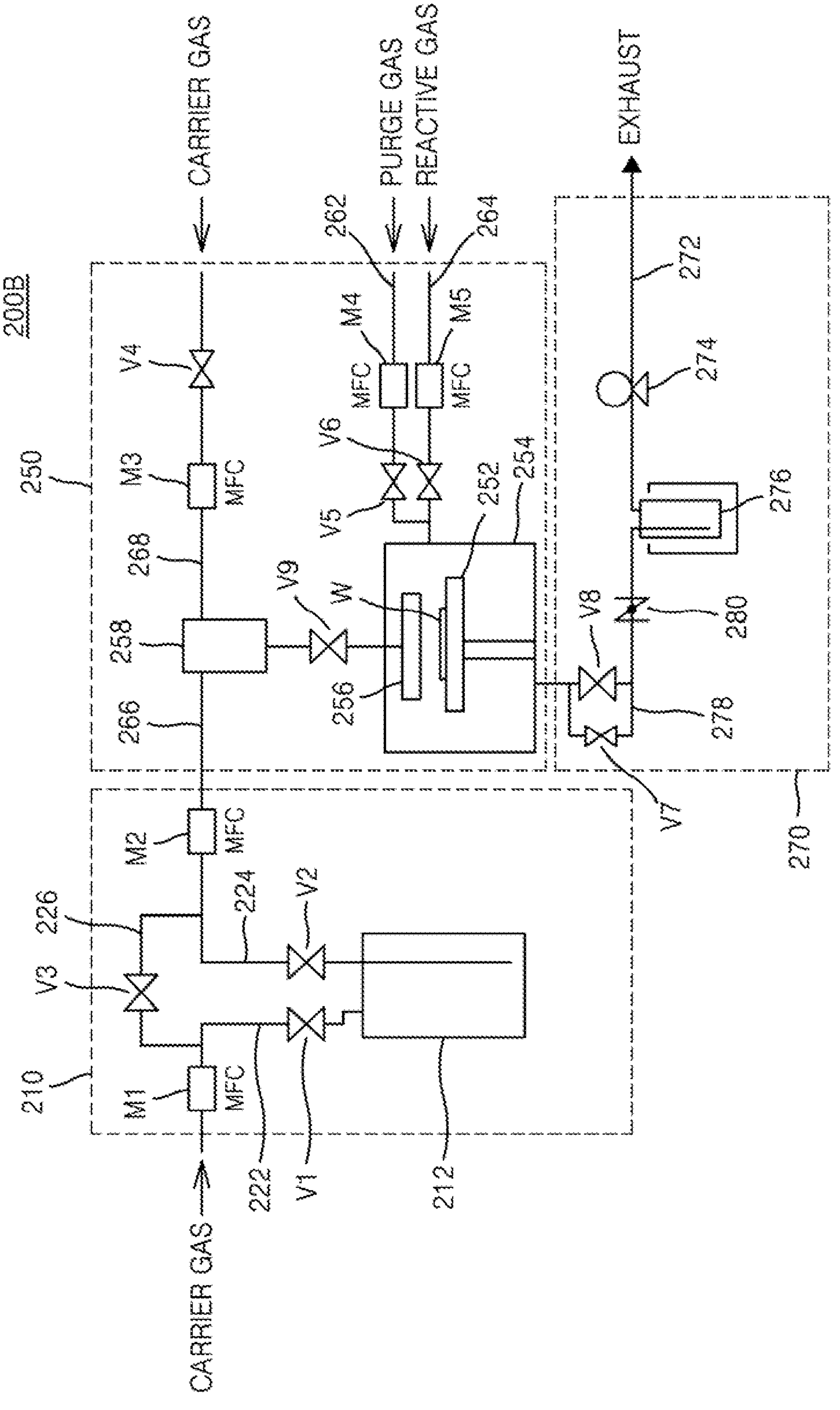
Figure 3C:
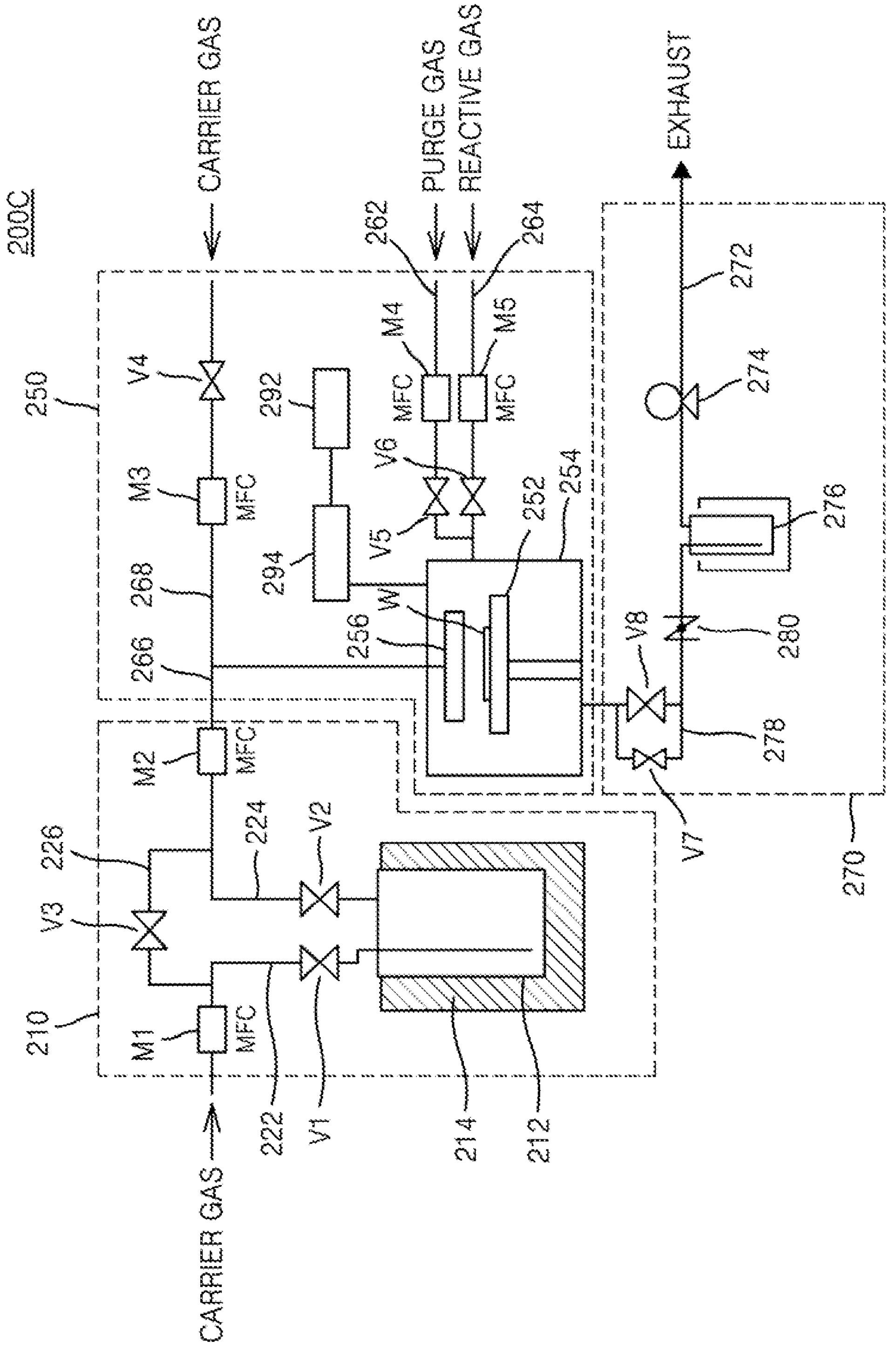

As in the deposition apparatuses (200A and 200C) shown in FIGS. 3A and 3C, a heater 214 may be mounted on the source material container 212. The source compound accommodated in the source material container 212 may be maintained at a relatively high temperature by the heater 214.

Figure 3D:
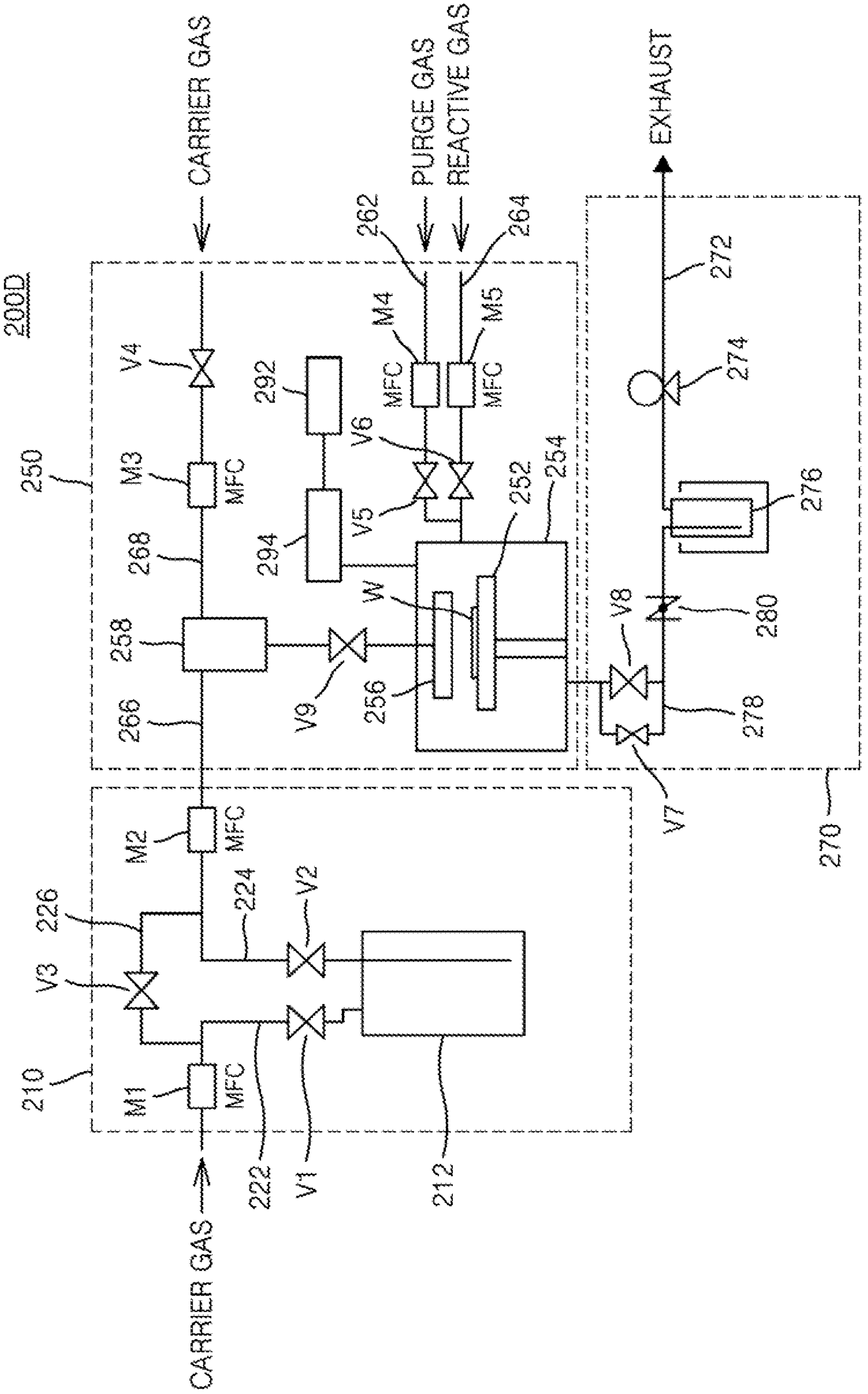

As in the deposition apparatuses (200B and 200D) shown in FIGS. 3B and 3D, a vaporizer 258 may be mounted on the inflow line 266 of the thin film formation unit 250. The vaporizer 258 may vaporize a fluid supplied in a liquid state from the fluid transfer unit 210 and may supply the vaporized source compound into the reaction chamber 254. The source compound vaporized by the vaporizer 258, together with the carrier gas supplied through the inflow line 268, may be supplied into the reaction chamber 254. Inflow of the source compound, which is supplied to the reaction chamber 254 through the vaporizer 258, may be controlled by a valve V9.

In addition, as in the deposition apparatuses (200C and 200D) shown in FIGS. 3C and 3D, to generate plasma inside the reaction chamber 254, the thin film formation unit 250 may include an RF power supply 292 and an RF matching system 294, which are connected to the reaction chamber 254.

In an implementation, as illustrated in the drawings, one source material container 212 may be connected to the reaction chamber 254. In an implementation, the fluid transfer unit 210 may include a plurality of source material containers 212, as needed, and each of the plurality of source material containers 212 may be connected to the reaction chamber 254. The number of source material containers 212 connected to the reaction chamber 254 may vary.

To vaporize the source material for metal-containing film formation, which includes the organometallic adduct compound represented by General Formula (I), the vaporizer 258 may be used in one of the deposition apparatuses 200B and 200D shown in FIGS. 3B and 3D.

To form the metal-containing film on the substrate in accordance with the method of manufacturing an integrated circuit device, which has been described with reference to FIGS. 1 and 2, one of the deposition apparatuses 200A, 200B, 200C, and 200D shown in FIGS. 3A to 3D may be used. To this end, the organometallic adduct compound according to an embodiment, which has the structure of General Formula (I), may be transported by various methods and supplied into a reaction space of a thin film formation apparatus, for example, the reaction chamber 254 of the deposition apparatuses 200A, 200B, 200C, and 200D shown in FIGS. 3A to 3D.

In an implementation, to form the metal-containing film in accordance with the method described with reference to FIGS. 1 and 2, the metal-containing film may be simultaneously formed on a plurality of substrates by using batch-type equipment instead of single-type equipment such as the deposition apparatuses 200A, 200B, 200C, and 200D shown in FIGS. 3A to 3D.

In forming the metal-containing film in accordance with the method of manufacturing an integrated circuit device according to an embodiment, conditions for forming the metal-containing film may include a reaction temperature (substrate temperature), a reaction pressure, a deposition rate, or the like.

In an implementation, a reaction temperature may be selected from a temperature range allowing the organometallic adduct compound, e.g., the organometallic adduct compound having the structure of General Formula (I), to be sufficiently reacted, e.g., a temperature range of about 150° C. or higher, a temperature range of about 150° C. to about 600° C., or a temperature range of about 400° C. to about 550° C.

The reaction pressure may be selected from a range of about 10 Pa to atmospheric pressure in the case of a thermal CVD process or an optical CVD process, or a range of about 10 Pa to about 2000 Pa in the case of using plasma.

In addition, the deposition rate may be controlled by adjusting conditions for supplying the source compound (e.g., a vaporization temperature and a vaporization pressure), the reaction temperature, and the reaction pressure. In the thin film formation method according to an embodiment, the deposition rate of the metal-containing film may be selected from a range of about 0.01 nm/min to about 100 nm/min, e.g., about 0.1 nm/min to about 50 nm/min. When the metal-containing film is formed by an ALD process, the number of ALD cycles may be adjusted to control the metal-containing film to a desired thickness.

In an implementation, when the metal-containing film is formed by an ALD process, energy such as plasma, light, or voltage may be applied. A time point of applying the energy may be variously selected. In an implementation, at a time point when a source gas including the organometallic adduct compound is introduced into the reaction chamber, at a time point when the source gas is adsorbed onto the substrate, at a time point of an exhaust process by the purge gas, at a time point when the reactive gas is introduced into the reaction chamber, or between each of these time points, the energy such as plasma, light, or voltage may be applied.

In an implementation, after the metal-containing film is formed by using the organometallic adduct compound having the structure of General Formula (I), the thin film formation method may further include a process of performing annealing under an inert atmosphere, an oxidizing atmosphere, or a reducing atmosphere. In an implementation, to fill steps formed at a surface of the metal-containing film, a reflow process may be performed on the metal-containing film, as needed. Each of the annealing process and the reflow process may be performed at a temperature selected from a range of about 200° C. to about 1,000° C., e.g., about 250° C. to about 500° C.

In an implementation, by appropriately selecting the organometallic adduct compound, the other precursor used together with the organometallic adduct compound, the reactive gas, and the process conditions for thin film formation, various metal-containing films may be formed. In an implementation, the metal-containing film formed according to an embodiment may include niobium atoms or tantalum atoms. In an implementation, the metal-containing film may include a niobium film, a niobium oxide film, a niobium nitride film, a niobium alloy film, a niobium-containing composite oxide film, a tantalum film, a tantalum oxide film, a tantalum nitride film, a tantalum alloy film, a tantalum-containing composite oxide film, or the like. The niobium alloy film may include, e.g., an Nb—Hf alloy, an Nb—Ti alloy, or the like. The tantalum alloy film may include, e.g., a Ta—Ti alloy, a Ta—W alloy, or the like. The metal-containing film may be used as materials of various components constituting an integrated circuit device. In an implementation, the metal-containing film may be used for an electrode material of a dynamic random access memory (DRAM) device, a gate of a transistor, a resistor, a diamagnetic film used for a hard device recording layer, a catalyst material for solid polymer fuel cells, a conductive barrier film used for metal wiring lines, a dielectric film of a capacitor, a barrier metal film for liquid crystals, a member for thin-film solar cells, a member for semiconductor equipment, a nano-structure, or the like.

FIGS. 4A to 4J are cross-sectional views of stages in a method of manufacturing an integrated circuit device 300 (see FIG. 4J), according to embodiments.

Figure 4A:
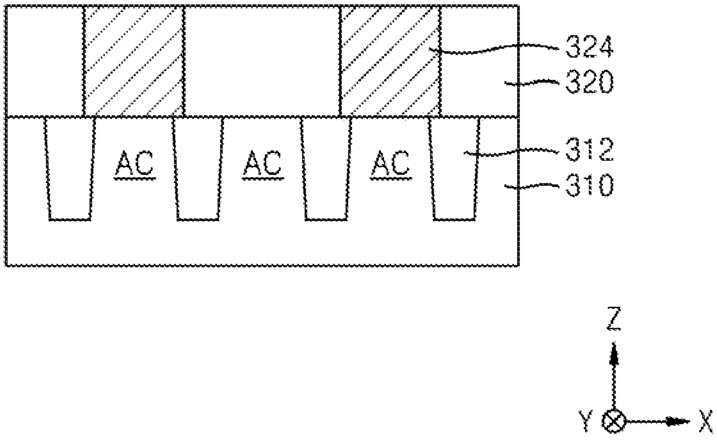
FIGS. 4A to 4J are cross-sectional views of stages in a method of manufacturing an integrated circuit device according to embodiments.

Referring to FIG. 4A, an interlayer insulating film 320 may be formed on a substrate 310 including a plurality of active regions AC, and then, a plurality of conductive regions 324 are formed to be connected to at least one of the plurality of active regions AC through the interlayer insulating film 320.

The substrate 310 may include a semiconductor such as Si or Ge, or a compound semiconductor, e.g., SiGe, SiC, GaAs, InAs, or InP. The substrate 310 may include a conductive region, e.g., an impurity-doped well, or an impurity-doped structure. The plurality of active regions AC may be defined by a plurality of device isolation regions 312 formed in the substrate 310. A device isolation region 312 may include a silicon oxide film, a silicon nitride film, a silicon oxynitride film, or a combination thereof. The interlayer insulating film 320 may include a silicon oxide film. The plurality of conductive regions 324 may be connected to one terminal of a switching device, such as a field effect transistor, formed on the substrate 310. The plurality of conductive regions 324 may each include polysilicon, a metal, a conductive metal nitride, a metal silicide, or a combination thereof.

Figure 4B:
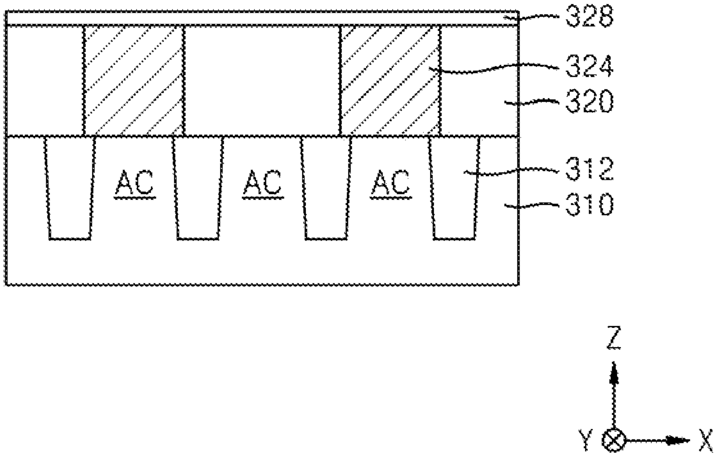

Referring to FIG. 4B, an insulating layer 328 may be formed to cover the interlayer insulating film 320 and the plurality of conductive regions 324. The insulating layer 328 may be used as an etch stop layer. The insulating layer 328 may include an insulating material having etch selectivity with respect to the interlayer insulating film 320 and a mold film 330 (see FIG. 4C) that is formed in a subsequent process. The insulating layer 328 may include silicon nitride, silicon oxynitride, or a combination thereof.

Figure 4C:
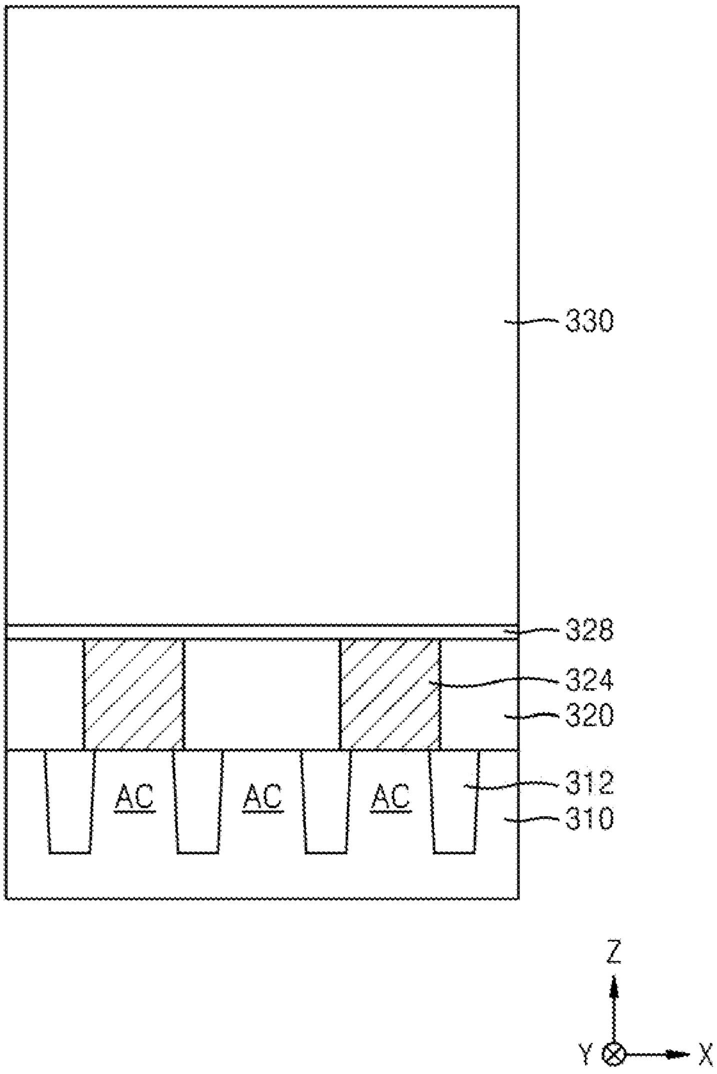

Referring to FIG. 4C, the mold film 330 may be formed on the insulating layer 328.

The mold film 330 may include an oxide film. In an implementation, the mold film 330 may include an oxide film such as borophosphosilicate glass (BPSG), phosphosilicate glass (PSG), undoped silicate glass (USG), or the like. To form the mold film 330, a thermal CVD process or a plasma CVD process may be used. The mold film 330 may have, e.g., a thickness of about 1,000 Å to about 20,000 Å. In an implementation, the mold film 330 may include a support film. The support film may include a material having etch selectivity with respect to the mold film 330. The support film may include a material having a relatively low etch rate in an etching atmosphere used to remove the mold film 330 in a subsequent process, e.g., in an etchant including ammonium fluoride ($NH_4F$), hydrofluoric acid (HF), and water. In an implementation, the support film may include silicon nitride, silicon carbonitride, tantalum oxide, titanium oxide, or a combination thereof.

Figure 4D:
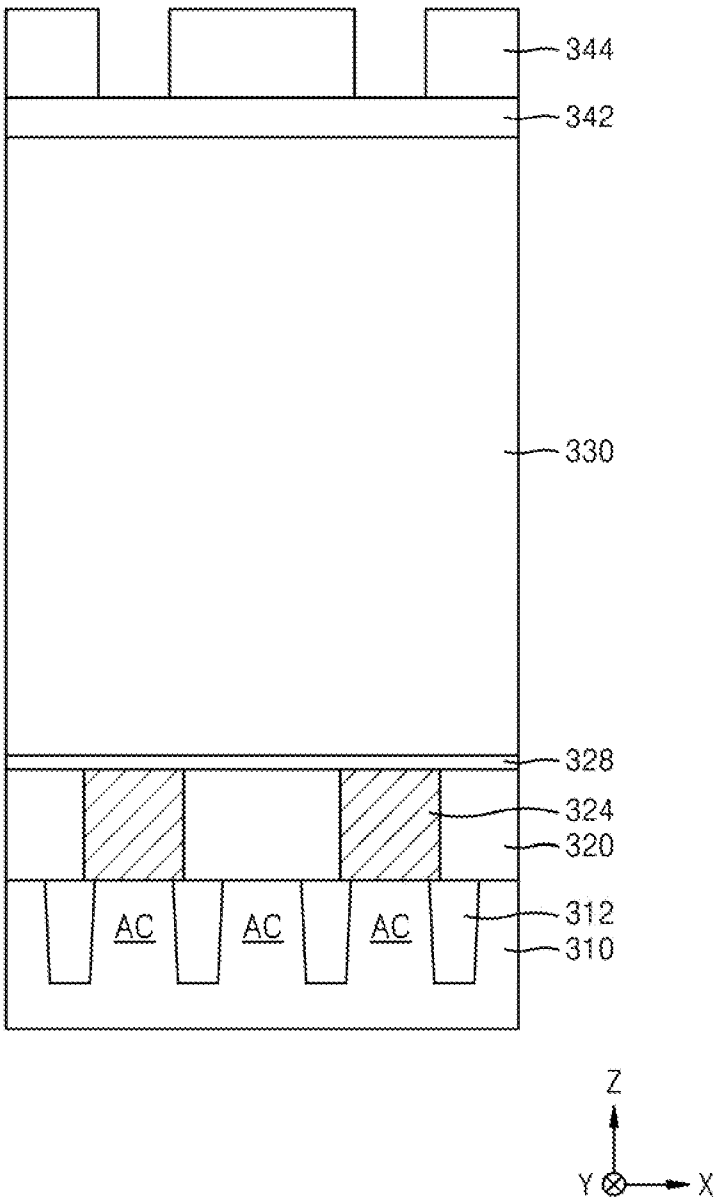

Referring to FIG. 4D, a sacrificial film 342 and a mask pattern 344 may be sequentially formed on the mold film 330 in the stated order.

The sacrificial film 342 may include an oxide film. The mask pattern 344 may include an oxide film, a nitride film, a polysilicon film, a photoresist film, or a combination thereof. A region in which a lower electrode of a capacitor is to be formed may be defined by the mask pattern 344.

Figure 4E:
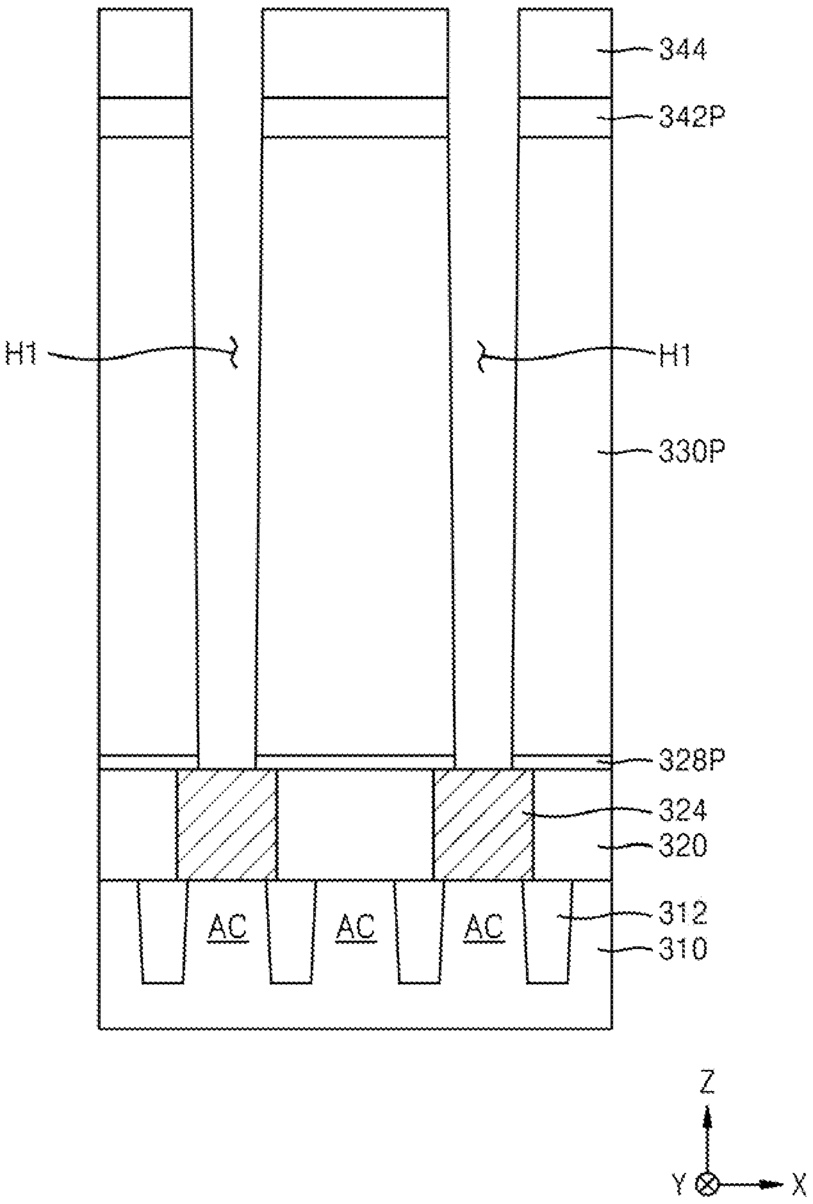

Referring to FIG. 4E, by dry-etching the sacrificial film 342 and the mold film 330 by using the mask pattern 344 as an etch mask and using the insulating layer 328 as an etch stop layer, a sacrificial pattern 342P and a mold pattern 330P may be formed to define a plurality of holes H1. Here, the insulating layer 328 may also be etched due to over-etching, and thus, an insulating pattern 328P may be formed to expose the plurality of conductive regions 324.

Figure 4F:
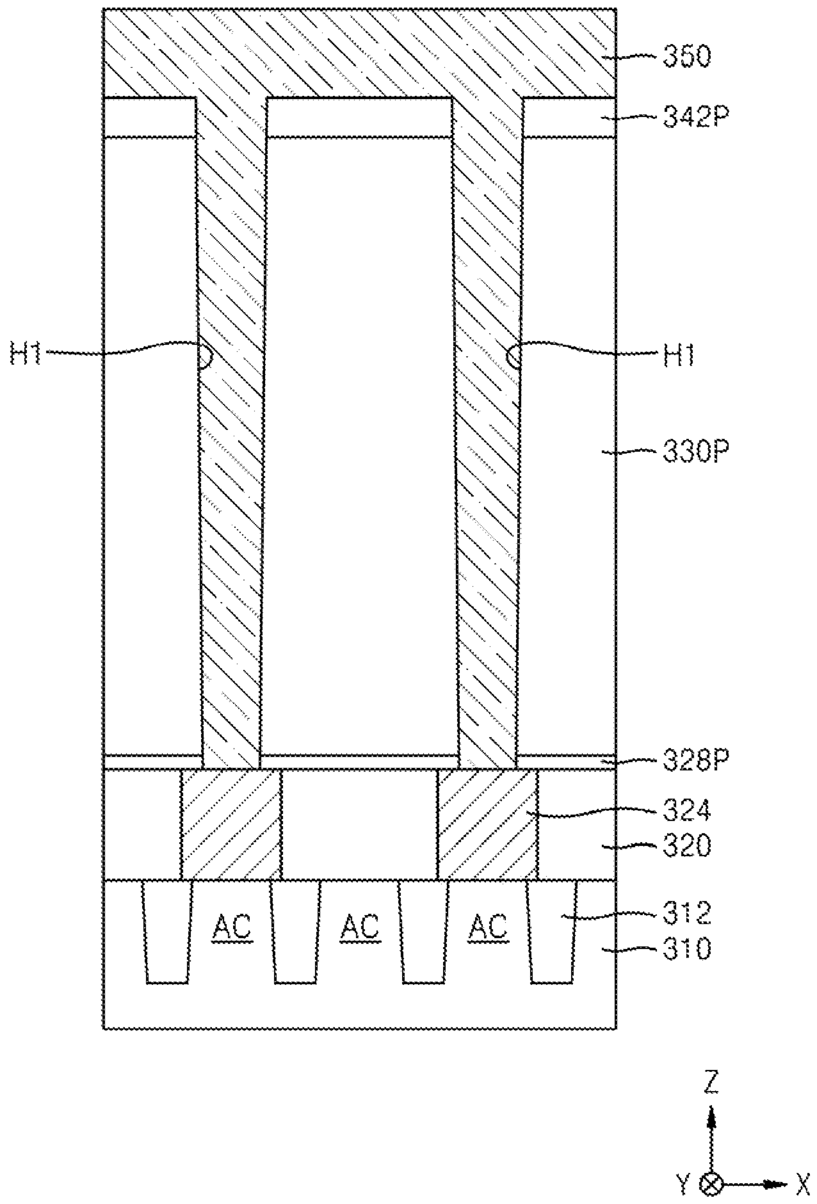

Referring to FIG. 4F, the mask pattern 344 may be removed from a result product of FIG. 4E, and then, a conductive film 350 for lower electrode formation may be formed to fill the plurality of holes H1 and cover an exposed surface of the sacrificial pattern 342P.

The conductive film 350 for lower electrode formation may include a doped semiconductor, a conductive metal nitride, a metal, a metal silicide, a conductive oxide, or a combination thereof. In an implementation, the conductive film 350 for lower electrode formation may include, e.g., NbN, TiN, TiAlN, TaN, TaAlN, W, WN, Ru, $RuO_2$, $SrRuO_3$, Ir, $IrO_2$, Pt, PtO, SRO ($SrRuO_3$), BSRO ($(Ba,Sr)RuO_3$), CRO ($CaRuO_3$), LSCo ($(La,Sr)CoO_3$), or a combination thereof. To form the conductive film 350 for lower electrode formation, a CVD, metal organic CVD (MOCVD), or ALD process may be used.

In an implementation, to form the conductive film 350 for lower electrode formation, a metal-containing film may be formed by the process P20 of FIG. 1 or by the method described with reference to FIG. 2. In an implementation, the conductive film 350 for lower electrode formation may include an NbN film. The NbN film may be a film formed by the process P20 of FIG. 1 or by the method described with reference to FIG. 2. To form the conductive film 350 for lower electrode formation, one of the deposition apparatuses 200A, 200B, 200C, and 200D shown in FIGS. 3A to 3D may be used.

Figure 4G:
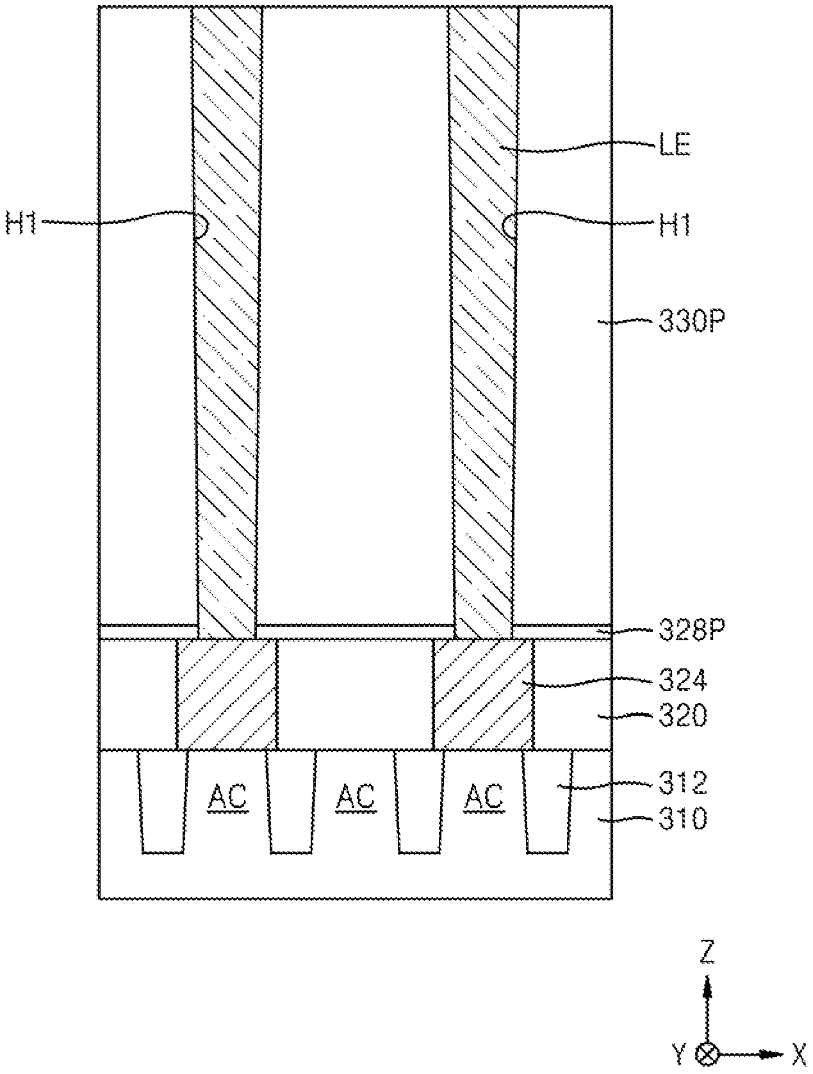

Referring to FIG. 4G, a plurality of lower electrodes LE may be formed from the conductive film 350 for lower electrode formation by partially removing an upper portion of the conductive film 350 for lower electrode formation.

To form the plurality of lower electrodes LE, an upper portion of the conductive film 350 for lower electrode formation, and the sacrificial pattern 342P (see FIG. 4F) may be removed by an etchback process or a chemical mechanical polishing (CMP) process so that an upper surface of the mold pattern 330P is exposed.

Figure 4H:
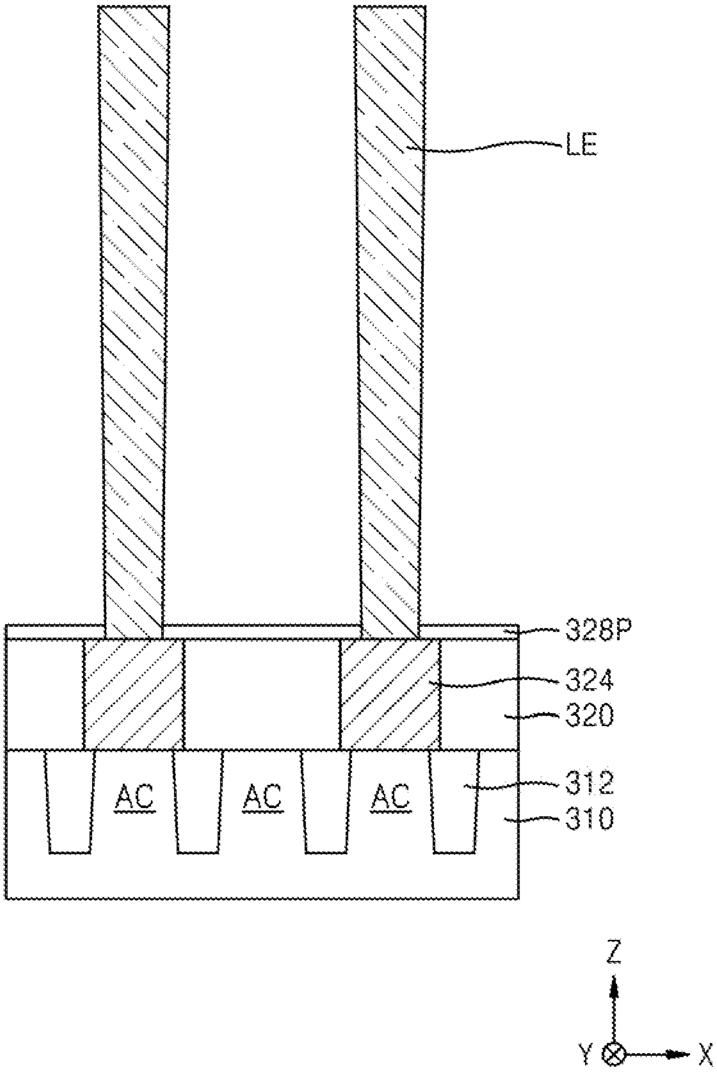

Referring to FIG. 4H, outer surfaces of the plurality of lower electrodes LE may be exposed by removing the mold pattern 330P from a result product of FIG. 4G. The mold pattern 330P may be removed by a lift-off process using an etchant including ammonium fluoride ($NH_4F$), hydrofluoric acid (HF), and water.

Figure 4I:
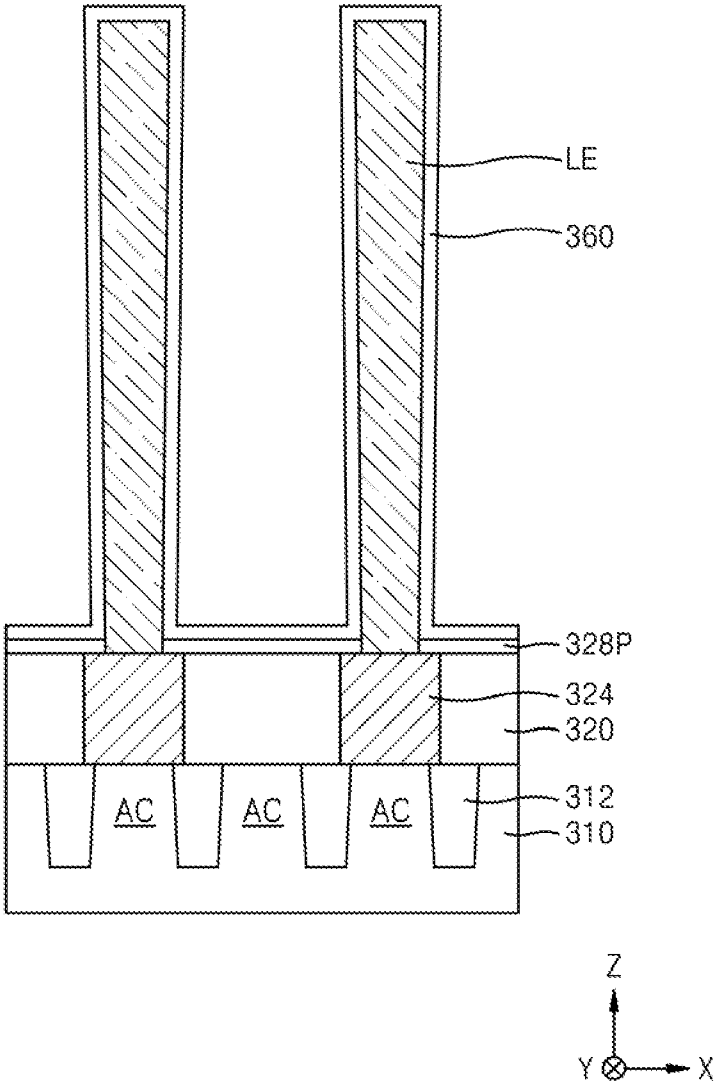

Referring to FIG. 4I, a dielectric film 360 may be formed on the plurality of lower electrodes LE.

The dielectric film 360 may be formed to conformally cover exposed surfaces of the plurality of lower electrodes LE.

In an implementation, the dielectric film 360 may include, e.g., hafnium oxide, hafnium oxynitride, hafnium silicon oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, or a combination thereof. The dielectric film 360 may be formed by an ALD process. The dielectric film 360 may have, e.g., a thickness of about 50 Å or about 150 Å.

In an implementation, before forming the dielectric film 360 on the plurality of lower electrodes LE, as described with reference to FIG. 4I, the method of manufacturing the integrated circuit device 300 may further include a process of forming a lower interface film, which covers the surface of each of the plurality of lower electrodes LE. In this case, the dielectric film 360 may be formed on the lower interface film. The lower interface film may include a metal-containing film including niobium or tantalum. To form the metal-containing film constituting the lower interface film, the process P20 of FIG. 1, or the method described with reference to FIG. 2 may be used. To form the lower interface film, one of the deposition apparatuses 200A, 200B, 200C, and 200D shown in FIGS. 3A to 3D may be used.

Figure 4J:
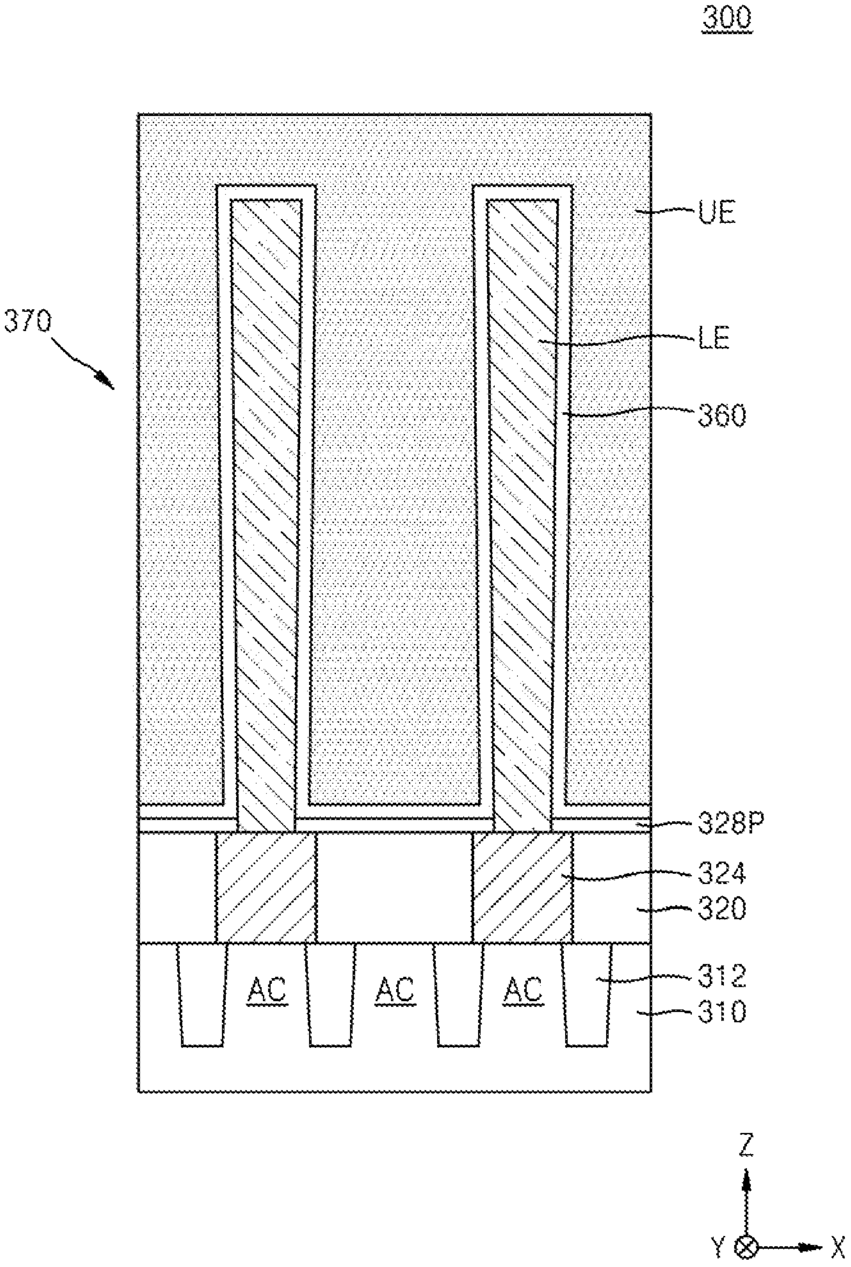

Referring to FIG. 4J, an upper electrode UE may be formed on the dielectric film 360. The lower electrode LE, the dielectric film 360, and the upper electrode UE may constitute a capacitor 370.

The upper electrode UE may include a doped semiconductor, a conductive metal nitride, a metal, a metal silicide, a conductive oxide, or a combination thereof. In an implementation, the upper electrode UE may include, e.g., NbN, TiN, TiAlN, TaN, TaAlN, W, WN, Ru, $RuO_2$, $SrRuO_3$, Ir, $IrO_2$, Pt, PtO, SRO ($SrRuO_3$), BSRO ($(Ba,Sr)RuO_3$), CRO ($CaRuO_3$), LSCo ($(La,Sr)CoO_3$), or a combination thereof. To form the upper electrode UE, a CVD, MOCVD, PVD, or ALD process may be used.

In an implementation, to form the upper electrode UE, a metal-containing film may be formed by the process P20 of FIG. 1 or by the method described with reference to FIG. 2. In an implementation, the upper electrode UE may include an NbN film. The NbN film may be a film formed by the process P20 of FIG. 1 or by the method described with reference to FIG. 2. To form the upper electrode UE, one of the deposition apparatuses 200A, 200B, 200C, and 200D shown in FIGS. 3A to 3D may be used.

In an implementation, as illustrated in FIGS. 4A to 4J, each of the plurality of lower electrodes LE may have a pillar shape. In an implementation, each of the plurality of lower electrodes LE may have a cross-sectional structure that has a cup shape or a cylindrical shape with a closed bottom end.

In the integrated circuit device 300 manufactured by the method described with reference to FIGS. 4A to 4J, the capacitor 370 may include the lower electrode LE having a 3-dimensional electrode structure. To help compensate for a reduction in capacitance due to a reduction in the design rule, an aspect ratio of the lower electrode LE with a 3-dimensional structure may be increased, and to form the lower electrode LE or the upper electrode UE with high quality in a deep and narrow 3-dimensional space, an ALD process may be used. In accordance with the method of manufacturing an integrated circuit device according to an embodiment, which has been described with reference to FIGS. 4A to 4J, the organometallic adduct compound, represented by General Formula (I), may be used in forming the lower electrode LE or the upper electrode UE, thereby improving process stability.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Synthesis Example 1

Synthesis of compound represented by Formula 2

Under an Ar atmosphere, 1.88 g (10.0 mmol) of $NbF_5$(V) and 20 mL of dehydrated dichloromethane were introduced into a 100 mL 4-neck flask and then stirred at ambient temperature. 0.97 g (10 mmol) of 3-fluoropyridine was added dropwise to the flask, followed by stirring the components at ambient temperature for 3 hours. An obtained result product underwent solvent removal and purification, thereby obtaining 2.41 g of the compound represented by Formula 2. (Yield 84.5%)

(Analysis)

(1) 1H-NMR (heavy benzene).

8.27 ppm (1H, multiplet), 8.05 ppm (1H, multiplet), 6.21 ppm (1H, multiplet), 6.00 ppm (1H, multiplet)

(2) Elemental analysis (theoretical value)

Nb: 39.9% (32.6%), C: 21.4% (21.1%), H: 1.6% (1.4%), N: 5.1% (4.9%),

F: 40.7% (40.0%)

Synthesis Example 2

Synthesis of compound represented by Formula 4

Under an Ar atmosphere, 1.88 g (10.0 mmol) of $NbF_5$(V) and 20 mL of dehydrated dichloromethane were introduced into a 100 mL 4-neck flask and then stirred at ambient temperature. 1.15 g (10 mmol) of 2,6-difluoropyridine was added dropwise to the flask, followed by stirring the components at ambient temperature for 4 hours. An obtained result product underwent solvent removal and purification, thereby obtaining 2.75 g of the compound represented by Formula 4. (Yield 90.8%)

(Analysis)

(1) 1H-NMR (heavy benzene)

6.41 ppm (2H, quintet), 5.66 ppm (2H, doublet)

(2) Elemental analysis (theoretical value)

Nb: 31.2% (30.7%), C: 20.1% (19.8%), H: 1.5% (1.0%), N: 4.9% (4.6%),

F: 44.4% (43.9%)

Synthesis Example 3

Synthesis of compound represented by Formula 8

Under an Ar atmosphere, 2.70 g (10.0 mmol) of $NbCl_5$(V) and 30 mL of dehydrated dichloromethane were introduced into a 100 mL 4-neck flask and then stirred at ambient temperature. 0.97 g (10 mmol) of 3-fluoropyridine was added dropwise to the flask, followed by stirring the components at ambient temperature for 4 hours. An obtained result product underwent solvent removal and purification, thereby obtaining 3.25 g of the compound represented by Formula 8. (Yield 88.4%)

(Analysis)

(1) 1H-NMR (heavy benzene)

8.85 ppm (1H, multiplet), 8.53 ppm (1H, multiplet), 6.10 ppm (1H, multiplet), 5.91 ppm (1H, multiplet)

(2) Elemental analysis (theoretical value)

Nb: 26.1% (25.3%), C: 48.6% (48.3%), H: 1.6% (1.1%), N: 4.8% (3.8%),

F: 5.5% (5.2%), Cl: 48.6% (48.3%)

Synthesis Example 4

Synthesis of compound represented by Formula 14

Under an Ar atmosphere, 1.88 g (10.0 mmol) of $NbF_5$(V) and 20 mL of dehydrated dichloromethane were introduced into a 100 mL 4-neck flask and then stirred at ambient temperature. 1.14 g (10 mmol) of 3-chloropyridine was added dropwise to the flask, followed by stirring the components at ambient temperature for 3 hours. An obtained result product underwent solvent removal and purification, thereby obtaining 2.32 g of the compound represented by Formula 14. (Yield 77.0%)

(Analysis)

(1) 1H-NMR (heavy benzene)

8.48 ppm (1H, multiplet), 8.18 ppm (1H, multiplet), 6.56 ppm (1H, multiplet), 6.06 ppm (1H, multiplet)

(2) Elemental analysis (theoretical value)

Nb: 31.5% (30.8%), C: 20.1% (19.9%), H: 1.9% (1.3%), N: 5.4% (4.7%),

F: 32.2% (31.5%), Cl: 12.3% (11.8%)

Synthesis Example 5

Synthesis of compound represented by Formula 27

Under an Ar atmosphere, 1.88 g (10.0 mmol) of $NbF_5$(V) and 20 mL of dehydrated dichloromethane were introduced into a 100 mL 4-neck flask and then stirred at ambient temperature. 0.93 g (10 mmol) of 4-methylpyridine was added dropwise to the flask, followed by stirring the components at ambient temperature for 3 hours. An obtained result product underwent solvent removal and purification, thereby obtaining 2.50 g of the compound represented by Formula 27. (Yield 89.0%)

(Analysis)

(1) 1H-NMR (heavy benzene)

8.24 ppm (2H, multiplet), 6.07 ppm (2H, multiplet), 1.39 ppm (3H, singlet)

(2) Elemental analysis (theoretical value)

Nb: 33.5% (33.1%), C: 26.0% (25.6%), H: 2.9% (2.5%), N: 5.8% (5.0%),

F: 34.2% (33.8%)

Synthesis Example 6

Synthesis of compound represented by Formula 38

Under an Ar atmosphere, 1.88 g (10.0 mmol) of $NbF_5$(V) and 20 mL of dehydrated dichloromethane were introduced into a 100 mL 4-neck flask and then stirred at ambient temperature. 1.07 g (10 mmol) of 3-ethylpyridine was added dropwise to the flask, followed by stirring the components at ambient temperature for 3 hours. An obtained result product underwent solvent removal and purification, thereby obtaining 2.60 g of the compound represented by Formula 38. (Yield 88.1%)

(Analysis)

(1) 1H-NMR (heavy benzene)

8.42 ppm (1H, singlet), 8.31 ppm (1H, multiplet), 6.62 ppm (1H, multiplet), 6.33 ppm (1H, multiplet), 1.74 ppm (2H, quartet), 0.57 ppm (3H, triplet)

(2) Elemental analysis (theoretical value)

Nb: 31.8% (31.5%), C: 29.0% (28.5%), H: 3.6% (3.1%), N: 5.2% (4.8%),

F: 33.0% (32.2%)

Synthesis Example 7

Synthesis of compound represented by Formula 75

Under an Ar atmosphere, 1.88 g (10.0 mmol) of $NbF_5$(V) and 20 mL of dehydrated dichloromethane were introduced into a 100 mL 4-neck flask and then stirred at ambient temperature. 1.47 g (10 mmol) of 4-(trifluoromethyl)pyridine was added dropwise to the flask, followed by stirring the components at ambient temperature for 3 hours. An obtained result product underwent solvent removal and purification, thereby obtaining 3.08 g of the compound represented by Formula 75. (Yield 92.0%)

(Analysis)

(1) 1H-NMR (heavy benzene)

8.12 ppm (2H, singlet, broad), 6.28 ppm (2H, multiplet)

(2) Elemental analysis (theoretical value)

Nb: 28.2% (27.7%), C: 22.0% (21.5%), H: 1.6% (1.2%), N: 4.8% (4.2%),

F: 46.0% (45.4%)

Synthesis Example 8

Synthesis of compound represented by Formula 80

Under an Ar atmosphere, 2.70 g (10.0 mmol) of $NbCl_5$(V) and 30 mL of dehydrated dichloromethane were introduced into a 100 mL 4-neck flask and then stirred at ambient temperature. 1.47 g (10 mmol) of 3-(trifluoromethyl)pyridine was added dropwise to the flask, followed by stirring the components at ambient temperature for 4 hours. An obtained result product underwent solvent removal and purification, thereby obtaining 3.30 g of the compound represented by Formula 80. (Yield 79.0%)

(Analysis)

(1) 1H-NMR (heavy benzene)

9.43 ppm (1H, singlet), 8.73 ppm (1H, doublet), 6.62 ppm (1H, doublet), 5.91 ppm (1H, multiplet)

(2) Elemental analysis (theoretical value)

Nb: 23.0% (22.3%), C: 17.6% (17.3%), H: 1.6% (1.0%), N: 3.8% (3.4%),

F: 14.0% (13.7%), Cl: 43.0% (42.5%)

Synthesis Example 9

Synthesis of compound represented by Formula 81

Under an Ar atmosphere, 2.70 g (10.0 mmol) of $NbCl_5$(V) and 30 mL of dehydrated dichloromethane were introduced into a 100 mL 4-neck flask and then stirred at ambient temperature. 1.47 g (10 mmol) of 4-(trifluoromethyl)pyridine was added dropwise to the flask, followed by stirring the components at ambient temperature for 4 hours. An obtained result product underwent solvent removal and purification, thereby obtaining 3.09 g of the compound represented by Formula 81. (Yield 74.0%)

(Analysis)

(1) 1H-NMR (heavy benzene)

8.70 ppm (2H, doublet), 6.27 ppm (2H, doublet)

(2) Elemental analysis (theoretical value)

Nb: 22.7% (22.3%), C: 17.9% (17.3%), H: 1.3% (1.0%), N: 4.0% (3.4%),

F: 14.1% (13.7%), Cl: 42.9% (42.5%)

Synthesis Example 10

Synthesis of compound represented by Formula 121

Under an Ar atmosphere, 1.88 g (10.0 mmol) of $NbF_5$(V) and 20 mL of dehydrated dichloromethane were introduced into a 100 mL 4-neck flask and then stirred at ambient temperature. 1.83 g (10 mmol) of 2,3-difluoropyridine was added dropwise to the flask, followed by stirring the components at ambient temperature for 3 hours. An obtained result product underwent solvent removal and purification, thereby obtaining 2.78 g of the compound represented by Formula 121. (Yield 75.0%)

(Analysis)

(1) 1H-NMR (heavy benzene)

8.27 ppm (singlet, 1H), 6.18 ppm (multiplet, 1H)

(2) Elemental analysis (theoretical value)

Nb: 25.5% (25.0%), C: 19.8% (19.4%), H: 0.9% (0.5%), N: 4.1% (3.8%),

F: 51.0% (51.2%)

Synthesis Example 11

Synthesis of compound represented by Formula 122

Under an Ar atmosphere, 1.88 g (10.0 mmol) of $NbF_5$(V) and 20 mL of dehydrated dichloromethane were introduced into a 100 mL 4-neck flask and then stirred at ambient temperature. 1.65 g (10 mmol) of 2-fluoro-5-(trifluoromethyl)pyridine was added dropwise to the flask, followed by stirring the components at ambient temperature for 3 hours. An obtained result product underwent solvent removal and purification, thereby obtaining 2.73 g of the compound represented by Formula 122. (Yield 77.4%)

(Analysis)

(1) 1H-NMR (heavy benzene)

8.58 ppm (singlet, 1H), 6.55 ppm (multiplet, 1H), 5.49 ppm (doublet, 1H)

(2) Elemental analysis (theoretical value)

Nb: 26.8% (26.3%), C: 20.9% (20.4%), H: 1.2% (0.9%), N: 4.1% (4.0%),

F: 49.0% (48.4%)

Synthesis Example 12

Synthesis of compound represented by Formula 134

Under an Ar atmosphere, 1.88 g (10.0 mmol) of $NbF_5$(V) and 20 mL of dehydrated dichloromethane were introduced into a 100 mL 4-neck flask and then stirred at ambient temperature. 1.61 g (10 mmol) of 3-(2,2,2-trifluoroethyl) pyridine was added dropwise to the flask, followed by stirring the components at ambient temperature for 3 hours. An obtained result product underwent solvent removal and purification, thereby obtaining 2.83 g of the compound represented by Formula 134. (Yield 81.2%)

(Analysis)

(1) 1H-NMR (heavy benzene)

8.39 ppm (singlet, 1H), 8.30 ppm (singlet, 1H), 6.62 ppm (multiplet, 1H), 6.20 ppm (singlet/broad, 1H), 2.17 ppm (quartet, 2H)

(2) Elemental analysis (theoretical value)

Nb: 27.0% (26.6%), C: 24.9% (24.1%), H: 2.0% (1.7%), N: 4.4% (4.0%),

F: 44.0% (43.6%)

Synthesis Example 13

Synthesis of compound represented by Formula 325

Under an Ar atmosphere, 1.88 g (10.0 mmol) of $NbF_5$(V) and 20 mL of dehydrated dichloromethane were introduced into a 100 mL 4-neck flask and then stirred at ambient temperature. 1.15 g (10 mmol) of 2,3-difluoropyridine was added dropwise to the flask, followed by stirring the components at ambient temperature for 4 hours. An obtained result product underwent solvent removal and purification, thereby obtaining 2.58 g of the compound represented by Formula 325. (Yield 85.1%)

(Analysis)

(1) 1H-NMR (heavy benzene)

7.68 ppm (doublet, 1H), 6.12 ppm (multiplet, 1H), 5.79 ppm (multiplet, 1H)

(2) Elemental analysis (theoretical value)

Nb: 31.3% (30.7%), C: 20.4% (19.8%), H: 1.2% (1.0%), N: 5.0% (4.6%),

F: 44.2% (43.9%)

Synthesis Example 14

Synthesis of compound represented by Formula 329

Under an Ar atmosphere, 1.88 g (10.0 mmol) of $NbF_5$(V) and 20 mL of dehydrated dichloromethane were introduced into a 100 mL 4-neck flask and then stirred at ambient temperature. 1.33 g (10 mmol) of 2,3,5-trifluoropyridine was added dropwise to the flask, followed by stirring the components at ambient temperature for 3 hours. An obtained result product underwent solvent removal and purification, thereby obtaining 2.44 g of the compound represented by Formula 329. (Yield 75.9%)

(Analysis)

(1) 1H-NMR (heavy benzene)

7.63 ppm (singlet, 1H), 5.61 ppm (multiplet, 1H)

(2) Elemental analysis (theoretical value)

Nb: 29.3% (29.0%), C: 18.9% (18.7%), H: 0.8% (0.6%), N: 4.7% (4.4%),

F: 47.8% (47.4%)

Evaluation Examples 1 to 14 and Comparative Evaluation Example 1

Next, the compounds of Formulae 2, 4, 8, 14, 27, 38, 75, 80, 81, 121, 122, 134, 325, and 329, which were obtained in Synthesis Examples 1 to 14, and Comparison Compound 1, shown below, were evaluated as to states thereof at 25° C., melting points thereof, and atmospheric Thermogravimetry-Differential Thermal Analysis (TG-DTA) mass 50% reduction temperature (T1) in the following methods, and results thereof are shown in Table 1.

[Comparison Compound 1]

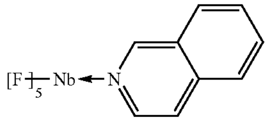

Evaluation of Melting Point

The state of each compound at 25° C. was observed by the naked eye. Each compound that is a solid at 25° C. was measured as to a melting point thereof by using melting point measuring equipment. A compound having a relatively low melting point may be suitable as a source material for thin film formation due to the facilitation of the supply thereof.

(2) Evaluation of atmospheric TG-DTA

By using TG-DTA, the mass 50% reduction temperature (T1) of each of the compounds of Formulae 2, 4, 8, 14, 27, 38, 75, 80, 81, 121, 122, 134, 325, and 329, which were obtained in Synthesis Examples 1 to 14, and Comparison Compound 1, was measured at atmospheric pressure under conditions of an Ar flow rate of 100 mL/min, a heating rate of 10° C./min, and a temperature scanning range of 30° C. to 600° C.

A compound having a relatively low atmospheric TG-DTA mass 50% reduction temperature (T1) may have a high vapor pressure and may be suitable as a source material for thin film formation.

TABLE 1

| Evaluation Example | Compound | State at 25° C. | Melting point | T1 (° C.) |
|---|---|---|---|---|
| Evaluation Example 1 | Formula 2 | Solid | 46 | 186 |
| Evaluation Example 2 | Formula 4 | Solid | 45 | 231 |
| Evaluation Example 3 | Formula 8 | Solid | 148 | 257 |
| Evaluation Example 4 | Formula 14 | Solid | 55 | 207 |
| Evaluation Example 5 | Formula 27 | Solid | 62 | 225 |
| Evaluation Example 6 | Formula 38 | Solid | 31 | 217 |
| Evaluation Example 7 | Formula 75 | Solid | 60 | 171 |
| Evaluation Example 8 | Formula 80 | Solid | 128 | 252 |
| Evaluation Example 9 | Formula 81 | Solid | 104 | 249 |
| Evaluation Example 10 | Formula 121 | Solid | 36 | 137 |
| Evaluation Example 11 | Formula 122 | Solid | 42 | 175 |
| Evaluation Example 12 | Formula 134 | Liquid | — | 175 |
| Evaluation Example 13 | Formula 325 | Solid | 60 | 187 |
| Evaluation Example 14 | Formula 329 | Solid | 71 | 148 |
| Comparative Evaluation Example 1 | Comparison Compound 1 | Solid | 154 | 276 |

In Table 1, it may be seen that the melting point of Comparison Compound 1 was equal to or greater than 150° C., and the melting points of the compounds of Formulae 2, 4, 8, 14, 27, 38, 75, 80, 81, 121, 122, 134, 325, and 329, which were obtained in Synthesis Examples 1 to 14, were less than 150° C. In particular, it may be seen that the compounds of Formulae 2, 4, 14, 27, 38, 75, 121, 122, 134, 325, and 329 had relatively low melting points, e.g., the melting points thereof were less than 75° C. In addition, the atmospheric TG-DTA mass 50% reduction temperature (T1) of Comparison Compound 1 was equal to or greater than 275° C., and the atmospheric TG-DTA mass 50% reduction temperatures (T1) of the compounds of Formulae 2, 4, 8, 14, 27, 38, 75, 80, 81, 121, 122, 134, 325, and 329, which were obtained in Synthesis Examples 1 to 14, were less than 260° C. It may be seen that the compounds according to the Examples had relatively high vapor pressures. It may be seen that, among the compounds of the Examples, the compounds of Formulae 2, 4, 14, 27, 38, 75, 121, 122, 134, 325, and 329 had particularly high vapor pressures because the atmospheric TG-DTA mass 50% reduction temperatures (T1) thereof were less than 235° C.

Evaluation Examples 15 to 28 and Comparative Evaluation Example 2 (formation of metal-containing film)

By using each of the compounds of Formulae 2, 4, 8, 14, 27, 38, 75, 80, and 81, which were obtained in Synthesis Examples 1 to 9, and Comparison Compound 1, as a source material and using the deposition apparatus of FIG. 3A, a niobium nitride film was formed on a silicon substrate. ALD process conditions for forming the niobium nitride film were as follows.

(Conditions)

Reaction temperature (Substrate temperature): 250° C.

Reactive gas: Ammonia gas (Processes)

Under the above-described conditions, by defining the following series of processes (1) to (4) as one cycle, 150 cycles were performed.

Process (1): A process of introducing a source material, which is vaporized at a source material container heating temperature of 90° C. and a source material container internal-pressure of 100 Pa, into a chamber and depositing the source material at an internal chamber pressure of 100 Pa for 30 seconds.

Process (2): A process of removing the unreacted source material by Ar purge for 10 seconds.

Process (3): A process of supplying the reactive gas and performing reaction at a chamber pressure of 100 Pa for 30 seconds.

Process (4): A process of removing the unreacted source material by Ar purge for 10 seconds.

Each of the thin films obtained through the above-described processes was measured regarding the thickness thereof by X-ray reflectivity, was identified regarding the compound thereof by X-ray diffraction, and was measured regarding the amount of carbon therein by X-ray photoelectron spectroscopy, and results thereof are shown in Table 2.

TABLE 2

| Evaluation Example | Compound | Film thickness | Compound of thin film | Amount of carbon |
|---|---|---|---|---|
| Evaluation Example 15 | Formula 2 | 6.0 nm | NbN | Not detected |
| Evaluation Example 16 | Formula 4 | 5.0 nm | NbN | Not detected |
| Evaluation Example 17 | Formula 8 | 3.0 nm | NbN | Not detected |
| Evaluation Example 18 | Formula 14 | 4.7 nm | NbN | Not detected |
| Evaluation Example 19 | Formula 27 | 4.0 nm | NbN | Not detected |
| Evaluation Example 20 | Formula 38 | 5.7 nm | NbN | Not detected |
| Evaluation Example 21 | Formula 75 | 4.3 nm | NbN | Not detected |
| Evaluation Example 22 | Formula 80 | 3.3 nm | NbN | Not detected |
| Evaluation Example 23 | Formula 81 | 3.7 nm | NbN | Not detected |
| Evaluation Example 24 | Formula 121 | 5.4 nm | NbN | Not detected |
| Evaluation Example 25 | Formula 122 | 5.2 nm | NbN | Not detected |
| Evaluation Example 26 | Formula 134 | 5.6 nm | NbN | Not detected |
| Evaluation Example 27 | Formula 325 | 4.9 nm | NbN | Not detected |
| Evaluation Example 28 | Formula 329 | 4.8 nm | NbN | Not detected |
| Comparative Evaluation Example 2 | Comparison Compound 1 | 2.3 nm | NbN | 5 atom % |

In Table 2, the limit in detection of the amount of carbon was 0.1 atom %. In the results of Table 2, among the thin films obtained by the ALD method, the thin film obtained from Comparison Compound 1 included carbon in an amount of 5 atom %. On the other hand, it may be seen that the thin films obtained from the compounds of Formulae 2, 4, 8, 14, 27, 38, 75, 80, 81, 121, 122, 134, 325, and 329, which were obtained in Synthesis Examples 1 to 14, included carbon in an amount equal to or less than 0.1 atom %, which was the detection limit, and thus had high quality. In addition, as a result of evaluating the thicknesses of the thin films obtained after performing 150 cycles of the ALD process, it may be seen that the thickness of the thin film obtained from Comparison Compound 1 was 2.3 nm or less, and the thicknesses of the thin films obtained from the compounds of Formulae 2, 4, 8, 14, 27, 38, 75, 80, 81, 121, 122, 134, 325, and 329, which were obtained in Synthesis Examples 1 to 14, were 3.0 nm or more. Thus, the productivity of the thin film formation process (according to the Examples) was excellent.

As may be seen from the above-described Evaluation Examples, the organometallic adduct compounds according to the embodiments may have relatively low melting points and relatively high vapor pressures, and may help improve the productivity of thin film formation when used as a source material for thin film formation by an ALD or CVD process.

By way of summation and review, a source compound for metal-containing film formation, which is capable of providing excellent filling properties and excellent step coverage in forming metal-containing films required to manufacture integrated circuit devices, and which has an advantage in process stability and mass-productivity due to easy handling thereof, has been considered.

One or more embodiments may provide an organometallic adduct compound, which includes niobium or tantalum as a metal.

One or more embodiments may provide a compound capable of being used as a source compound, which may provide excellent thermal stability, process stability, and mass-productivity in forming a metal-containing film required to manufacture an integrated circuit device.

One or more embodiments may provide a method of manufacturing an integrated circuit device, which may provide desired electrical properties by forming a metal-containing film with excellent quality by using a compound capable of providing excellent process stability and mass-productivity.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organometallic adduct compound represented by General Formula (I):

General Formula (I)

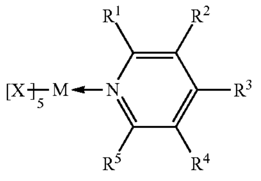

wherein, in General Formula (I), $R^1$, $R^2$, $R^3$, $R^4$, and $R^5$ are each independently
- a hydrogen atom,
- a halogen atom,
- a substituted or unsubstituted C1 to C5 linear alkyl group,
- a substituted or unsubstituted C3 to C5 branched alkyl group,
- a substituted or unsubstituted C2 to C5 linear alkenyl group, or
- a substituted or unsubstituted C3 to C5 branched alkenyl group, at least one of $R^1$, $R^2$, $R^3$, $R^4$, and $R^5$ is
- a fluorine atom,
- a fluorine atom-substituted C1 to C5 linear alkyl group,
- a fluorine atom-substituted C3 to C5 branched alkyl group,
- a fluorine atom-substituted C2 to C5 linear alkenyl group, or
- a fluorine atom-substituted C3 to C5 branched alkenyl group X is a halogen atom, and M is a niobium atom or a tantalum atom.

2. The organometallic adduct compound as claimed in claim 1, wherein at least one of $R^1$, $R^2$, $R^3$, $R^4$, and $R^5$ is a fluorine atom.

3. The organometallic adduct compound as claimed in claim 1, wherein at least one of $R^1$ and $R^2$ is a fluorine atom.

4. The organometallic adduct compound as claimed in claim 1, wherein:

M is a niobium atom, and at least one of $R^1$, $R^2$, $R^3$, $R^4$, and $R^5$ is a fluorine atom.

5. The organometallic adduct compound as claimed in claim 1, wherein:

X is a fluorine atom or a chlorine atom,

M is a niobium atom, and at least one of $R^1$, $R^2$, $R^3$, $R^4$, and $R^5$ is a fluorine atom.

6. The organometallic adduct compound as claimed in claim 1, wherein:

M is a niobium atom.

7. The organometallic adduct compound as claimed in claim 1, wherein:

X is a fluorine atom or a chlorine atom, and at least one of $R^1$, $R^2$, $R^3$, $R^4$, and $R^5$ includes a fluorine atom.

8. The organometallic adduct compound as claimed in claim 1, wherein:

X is a fluorine atom.

9. A method of manufacturing an integrated circuit device, the method comprising forming a metal-containing film on a substrate by using an organometallic adduct compound represented by General Formula (I):

General Formula (I)

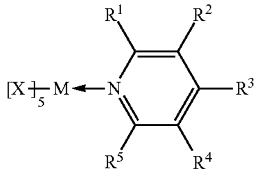

wherein, in General Formula (I), $R^1$, $R^2$, $R^3$, $R^4$, and $R^5$ are each independently
- a hydrogen atom,
- a halogen atom,
- a substituted or unsubstituted C1 to C5 linear alkyl group,
- a substituted or unsubstituted C3 to C5 branched alkyl group,
- a substituted or unsubstituted C2 to C5 linear alkenyl group, or
- a substituted or unsubstituted C3 to C5 branched alkenyl group, at least one of $R^1$, $R^2$, $R^3$, $R^4$, and $R^5$ is
- a fluorine atom,
- a fluorine atom-substituted C1 to C5 linear alkyl group,
- a fluorine atom-substituted C3 to C5 branched alkyl group,
- a fluorine atom-substituted C2 to C5 linear alkenyl group, or
- a fluorine atom-substituted C3 to C5 branched alkenyl group X is a halogen atom, and M is a niobium atom or a tantalum atom.

10. The method as claimed in claim 9, wherein, in General Formula (I), at least one of $R^1$, $R^2$, $R^3$, $R^4$, and $R^5$ is a fluorine atom.

11. The method as claimed in claim 9, wherein, in General Formula (I), at least one of $R^1$ and $R^2$ is a fluorine atom.

12. The method as claimed in claim 9, wherein, in General Formula (I):

X is a fluorine atom or a chlorine atom,

M is a niobium atom, and at least one of $R^1$, $R^2$, $R^3$, $R^4$, and $R^5$ is a fluorine atom.

13. The method as claimed in claim 9, wherein forming the metal-containing film includes:

supplying the organometallic adduct compound represented by General Formula (I) onto the substrate; and supplying a reactive gas onto the substrate.

14. The method as claimed in claim 13, wherein the reactive gas includes $NH_3$, $N_2$ plasma, an organic amine compound, a hydrazine compound, or a combination thereof.

15. The method as claimed in claim 9, wherein, in General Formula (I):

M is a niobium atom, and forming the metal-containing film includes forming an NbN film.

16. An organometallic adduct compound represented by General Formula (I):

General Formula (I)

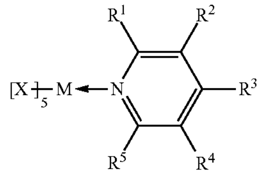

wherein, in General Formula (I), $R^1$, $R^2$, $R^3$, $R^4$, and $R^5$ are each independently a hydrogen atom, a halogen atom, a substituted or unsubstituted C1 to C5 linear alkyl group, a substituted or unsubstituted C3 to C5 branched alkyl group, a substituted or unsubstituted C2 to C5 linear alkenyl group, or a substituted or unsubstituted C3 to C5 branched alkenyl group, at least one of $R^1$, $R^2$, $R^3$, $R^4$, and $R^5$ is a halogen atom, X is a halogen atom, and M is a niobium atom or a tantalum atom.

* * * * *